US008241947B2

(12) United States Patent
Liu et al.

(10) Patent No.: US 8,241,947 B2
(45) Date of Patent: Aug. 14, 2012

(54) PHASE CHANGE MEMORY ELEMENTS USING ENERGY CONVERSION LAYERS, MEMORY ARRAYS AND SYSTEMS INCLUDING SAME, AND METHODS OF MAKING AND USING SAME

(75) Inventors: Jun Liu, Boise, ID (US); Mike Violette, Boise, ID (US); Jon Daley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/873,335

(22) Filed: Sep. 1, 2010

(65) Prior Publication Data

US 2010/0321992 A1 Dec. 23, 2010

Related U.S. Application Data

(62) Division of application No. 11/504,002, filed on Aug. 15, 2006, now Pat. No. 7,800,092.

(51) Int. Cl.
*H01L 47/00* (2006.01)

(52) U.S. Cl. ................ 438/102; 438/104; 257/2; 257/4; 257/E45.002

(58) Field of Classification Search .................. 257/2, 4; 438/102
See application file for complete search history.

(56) References Cited

U.S. PATENT DOCUMENTS 7,307,267 B2 12/2007 Lankhorst et al. ................ 257/2
7,642,538 B2 * 1/2010 Fujita et al. ....................... 257/2
2003/0183867 A1 * 10/2003 Fricke et al. .................. 257/314
2004/0188668 A1 9/2004 Hamann et al.
2005/0064606 A1 3/2005 Pellizzer et al.
2006/0203430 A1 9/2006 Pinnow et al.

FOREIGN PATENT DOCUMENTS

EP 1 688 958 A1 8/2006
WO WO 2004/057676 A2 7/2004

OTHER PUBLICATIONS

Park, Y., et al., "Writing Current Reduction in Phase Change Memory Device with U-shaped Heater (PCM-U)", Japanese Journal of Applied Physics, vol. 45, No. 20, 2006, pp. L516-L518.

Yin, Y. et al., "A Novel Lateral Phase-Change Random Access Memory Characterized by Ultra Low Reset Current and Power Consumption", Japanese Journal of Applied Physics, vol. 45, No. 28, 2006, pp. L726-L729.

Yin, Y. et al., "Electrical Properties of Phase Change and Channel Current control in Ultrathin Phase-Change Channel Transistor Memory by Annealing", Japanese Journal of Applied Physics; vol. 45, No. 4B, 2006, pp. 3238-3242.

Hamann, H. et al., "Ultra-High-Density Phase-Change Storage and Memory", Nature Materials, vol. 5, 2006, pp. 383-387, Nature Publishing Group, UK.

Written Opinion of the International Searching Authority, Feb. 26, 2009.

* cited by examiner

*Primary Examiner* — Jerome Jackson, Jr.
(74) *Attorney, Agent, or Firm* — Dickstein Shapiro LLP

(57) ABSTRACT

A phase change memory element and method of forming the same. The memory element includes a phase change material layer electrically coupled to first and second conductive material layers. A energy conversion layer is formed in association with the phase change material layer, and electrically coupled to a third conductive material layer. An electrically isolating material layer is formed between the phase change material layer and the energy conversion layer.

18 Claims, 22 Drawing Sheets

400 326a 336 330 334 332 317b 326 316 320 318 328 317a 312 314 310

B 330 326 317 316 316 A 318 314

200
212
210
222
240
232
228
220
217
226
28c
217
218a
216
215
214
217
230

B
A
226
218
217
216
222
214
236

PHASE CHANGE MEMORY ELEMENTS USING ENERGY CONVERSION LAYERS, MEMORY ARRAYS AND SYSTEMS INCLUDING SAME, AND METHODS OF MAKING AND USING SAME

CROSS REFERENCE TO RELATED APPLICATIONS

The present application is a divisional of U.S. patent application Ser. No. 11/504,002, filed Aug. 15, 2006 now U.S. Pat. No. 7,800,092, the disclosure of which is incorporated by reference in its entirety.

FIELD OF THE INVENTION

Embodiments of the invention relate to semiconductor devices, and in particular to phase change memory elements, memory arrays and systems including the same, and methods of forming and using the same.

BACKGROUND OF THE INVENTION

Non-volatile memories are important elements of integrated circuits due to their ability to retain data absent a power supply. Phase change materials have been investigated for use in non-volatile memory cells, including chalcogenide alloys, which are capable of stably transitioning between amorphous and crystalline phases. Each phase exhibits a particular resistance state and the resistance states distinguish the logic values of the memory element. Specifically, an amorphous state exhibits a relatively high resistance, and a crystalline state exhibits a relatively low resistance.

A conventional phase change memory element 1, illustrated in FIGS. 1A and 1B, has a layer of phase change material 8 between first and second electrodes 2, 4, which are supported by a dielectric material 6. The phase change material 8 is set to a particular resistance state according to the amount of current applied through the first and second electrodes 2, 4. To obtain an amorphous state (FIG. 1B), a relatively high write current pulse (a reset pulse) is applied through the conventional phase change memory element 1 to melt at least a portion 8*a* of the phase change material 8 covering the first electrode 2 for a first period of time. The current is removed and the phase change material 8 cools rapidly to a temperature below the crystallization temperature, which results in the portion 8*a* of the phase change material 8 covering the first electrode 2 having the amorphous state. To obtain a crystalline state (FIG. 1A), a lower current write pulse (a set pulse) is applied to the conventional phase change memory element 1 for a second period of time (typically longer in duration than the crystallization time of the amorphous phase change material) to heat the amorphous portion of the phase change material 8 to a temperature below its melting point, but above its crystallization temperature. This causes the amorphous portion 8*a* (FIG. 1B) of the phase change material 8 to re-crystallize to the crystalline state that is maintained once the current is removed and the phase change memory element 1 is cooled. The phase change memory element 1 is read by applying to the electrodes a read voltage, which does not change the phase state of the phase change material 8.

A sought after characteristic of non-volatile memory is low power consumption. Oftentimes, however, conventional phase change memory elements require large operating currents. As the phase change memory is scaled down to allow large scale device integration and per-bit current reduction, the programmable volume (e.g., portion 8*a* of FIGS. 1A and 1B) of the phase change cell is shrunk further with an increasing surface-to-volume ratio. The increased surface-to-volume ratio of the programmable volume (e.g., portion 8*a* of FIGS. 1A and 1B) causes increased thermal dissipation through the surface, and larger power density is required to achieve the same local heating in the programmable volume (e.g., portion 8*a* of FIGS. 1A and 1B). Consequently a larger current density is necessary (approximately $1\times10^{12}$ Amps/$m^2$) for the write operation of the phase change cell. The larger current density creates severe critical reliability issues such as electromigration of the phase change material atoms (e.g., germanium-antimony-tellurium (GeSbTe)) that are placed under a high electric field for the conventional phase change memory methodology in which the cell itself acts as the heating element.

It is therefore desirable to provide phase change memory elements with reduced current requirements. For phase change memory elements, it is necessary to have a current density that will heat the phase change material past its melting point and quench it in an amorphous state. One way to increase current density is to decrease the size of the first electrode (first electrode 2 of FIGS. 1A and 1B). These methods maximize the current density at the interface between the first electrode 2 and the phase change material 8. Although these conventional solutions are typically successful, it is desirable to further reduce the overall current flow in the phase change memory element, thereby reducing power consumption in certain applications, and possibly to reduce the current density passing through the phase change material to improve its reliability.

Another desired property of phase change memory is its switching reliability and consistency. Conventional phase change memory elements (e.g., phase change memory element 1 of FIGS. 1A and 1B) have phase change material layers (e.g., phase change material layer 8 of FIGS. 1A and 1B) that are not confined, and have the freedom to extend sideways. Accordingly, the interface between the migrated amorphous portions and crystalline portions of the phase change material may cause reliability issues during programming and reprogramming of the phase change cell.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate or wafer in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

Figure 2A:
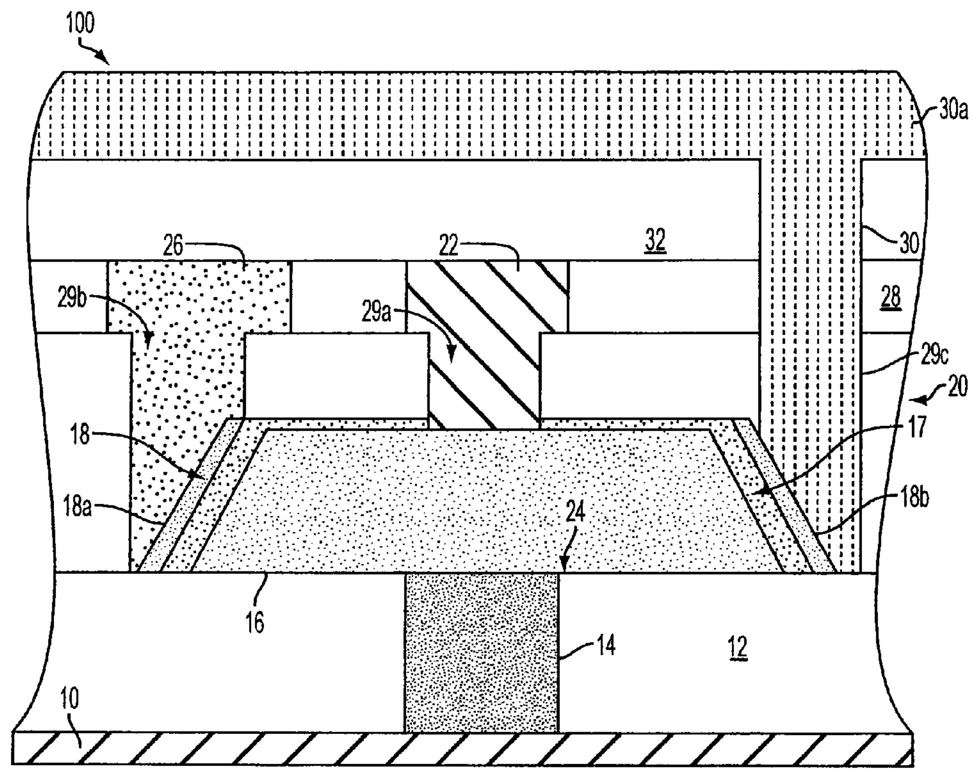
FIGS. 2A-2B illustrate partial cross-sectional and partial top-down views, respectively, of a phase change memory element constructed in accordance with an embodiment of the invention.
Figure 2B:
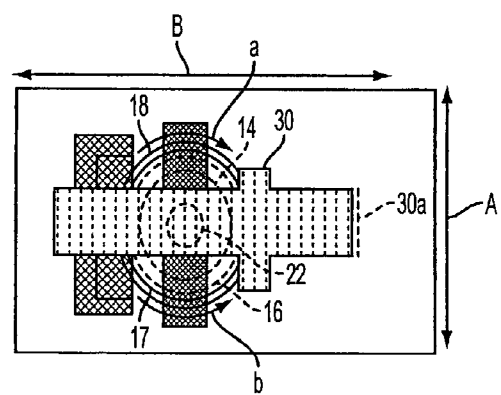

The invention is now explained with reference to the figures, which illustrate embodiments and throughout which like reference numbers indicate like features. FIGS. 2A and 2B illustrate a first embodiment of a phase change memory element 100 constructed in accordance with the invention.

The phase change memory element 100 includes a substrate 10 having a first dielectric layer 12 formed thereon, and a first electrode 14 formed in a via 24 within the first dielectric layer 12. The phase change memory element 100 also includes a phase change material layer 16 formed over, and in electrical communication with, the first electrode 14. The phase change memory element 100 also includes a energy conversion layer 18 that surrounds the phase change material layer 16. A material element 17 is formed between the energy conversion layer 18 and the phase change material layer 16 to electrically isolate the two structures. A second dielectric layer 20 is formed over and around the energy conversion layer 18.

The second dielectric material 20 includes first, second, and third vias 29*a*, 29*b*, 29*c*, which allow for second, third, and fourth electrodes 22, 26, 30, respectively, to be formed therein. A third dielectric layer 28 is formed to surround the second, third, and fourth electrodes 22, 26, 30. A fourth dielectric layer 32 is formed over the third dielectric layer 28. A metal line 30*a* is formed over the fourth dielectric layer 32, and connects with fourth electrode 30.

FIG. 2B illustrates a partial top-down view of the FIG. 2A phase change memory element 100. As illustrated, the energy conversion layer 18 surrounds the material element 17, which surrounds the phase change material layer 16. The first and second electrodes 14, 22 are in electrical communication with the phase change material layer 16. The third electrode 26 is in electrical communication with a first portion 18*a* of the energy conversion layer 18. The fourth electrode is also in electrical communication with a second portion 18*b* of the energy conversion layer 18. The second, third, and fourth electrodes 22, 26, 30 are illustrated as having a longitudinal extension in a first direction A. The metal line 30*a* runs in a second direction B, perpendicular to the first direction A, and contacts the fourth electrode 30, without contacting the second and third electrodes 22, 26.

In operation, the phase change memory element 100 has first, second, third, and fourth electrodes 14, 22, 26, 30 performing different functions. During the read operation of the phase change memory element 100, transistors in the periphery that are electrically coupled to the first and second electrodes 14, 22 are simultaneously turned on, and the resistive property of the phase change material layer 16 is read. For example, a high resistance (corresponding to an amorphous state of the phase change material layer 16) may represent a data value of "1." Conversely, a low resistance (corresponding to a crystalline state of the phase change material layer 16) may represent a data value of "0." The information is read out to peripheral circuitry, as discussed below with respect to FIGS. 7 and 18.

During the write operation of the phase change memory element 100, the third and fourth electrodes 26, 30 work in conjunction with one another to switch the state of the phase change material layer 16 from amorphous to crystalline or vice versa. In operation, transistors in the periphery that are electrically coupled to the third and fourth electrodes 26, 30 are turned on to allow current to flow through the energy conversion layer 18 (as indicated by the arrows a, b in FIG. 2B), which heats the phase change material layer 16 to switch the state of the phase change material layer 16.

Figure 1A:
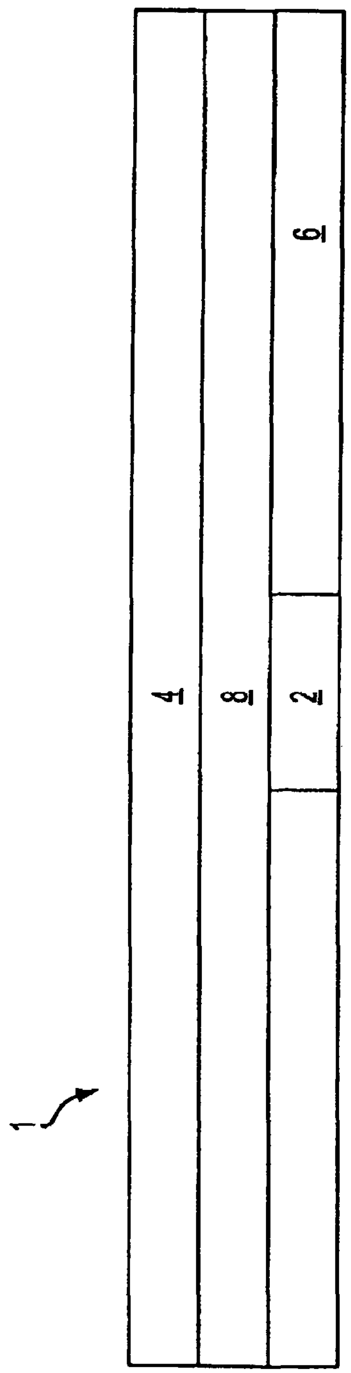
FIGS. 1A-1B illustrate a conventional phase change memory element.
Figure 1B:
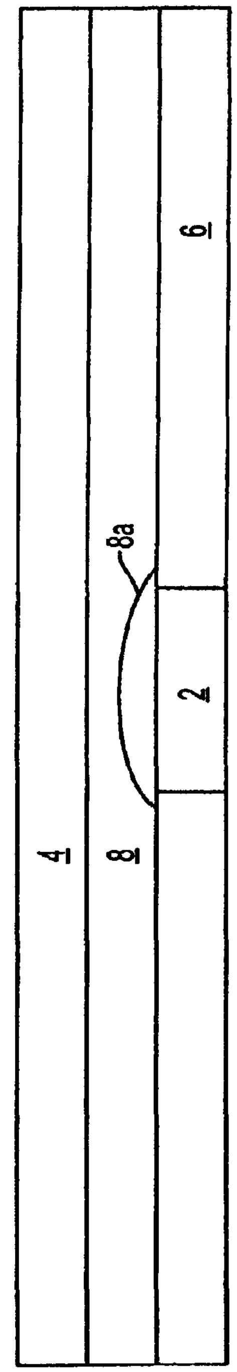

Conventional phase change memory elements (e.g., phase change memory element 1 of FIGS. 1A and 1B) typically use a large amount of current (about $1\times10^{12}$ A/m$^2$) that flows from the first electrode 2 through the phase change material layer 8 and to the second electrode 4 for both the write and read operations. The phase change memory element 100 of FIGS. 2A and 2B reduces the amount of current that flows through the phase change material layer 16 by providing the energy conversion layer 18 in association with third and fourth electrodes 26, 30 to switch the state of the phase change material layer 16, rather than applying a current directly through the phase change material layer 16. Additionally, the current required to activate the energy conversion layer 18 can be much lower than the current necessary to change the phase of the phase change material layer 16 if the current were flowing directly through the phase change material layer 16. Accordingly, the overall current requirements for the phase change cell 100 are reduced.

During the read operation of the phase change memory element 100, the current flow (through the first and second electrodes 14, 22) required to read the resistive state of the phase change material layer 16 is minimal as compared to that of writing to the phase change material layer 16. Therefore, by having separate mechanisms for the read and write operations of the phase change memory element 100, the amount of current that flows directly through the phase change material layer 16 is substantially reduced, which results in reduced reliability issues such as the electromigration of atoms of the phase change material, as discussed above with respect to FIGS. 1A and 1B.

It should be noted that the phase change memory element 100 is only an example, and is not intended to be limiting in any way. For example, a low resistance state of the phase change material layer 16 may correspond to a data value of "0"; whereas a high resistance state of the phase change material layer 16 may correspond to a data value of "1," and the shapes of the phase change material layer 16 and energy conversion layer 18 can have a top-down shape other than circular.

FIGS. 3A-6B illustrate a method of fabricating the phase change memory element 100 illustrated in FIGS. 2A and 2B. No particular order is required for any of the actions described herein, except for those logically requiring the results of prior actions. Accordingly, while the actions below are described as being performed in a specific order, the order is an example only and can be altered if desired. Although the formation of a single phase change memory element 100 is shown, it should be appreciated that the phase change memory element 100 can be one memory element in an array of memory elements, which can be formed concurrently.

Figure 3A:
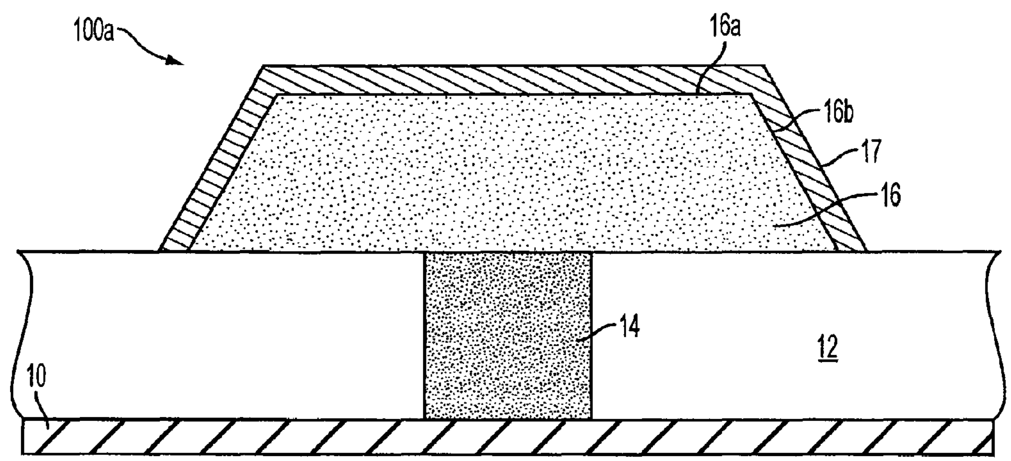
FIGS. 3A-6B illustrate partial cross-sectional and partial top-down views of an embodiment of a method of fabricating the embodiment of the phase change memory element of FIGS. 2A and 2B.
Figure 3B:
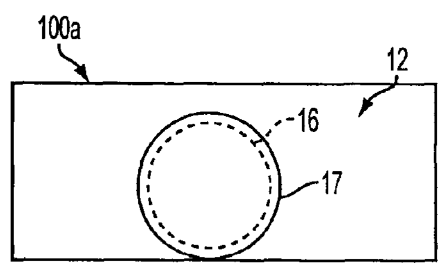

FIGS. 3A and 3B illustrate a partial cross sectional view and a partial top down view, respectively, of an intermediate structure 100*a*. The intermediate structure 100*a* is formed by providing a first dielectric layer 12 over a substrate 10. The first dielectric layer 12 is typically etched to create vias 24 (FIG. 2B) within which a first electrode 14 is formed by blanket deposition and then chemical mechanical polishing (CMP) to the surface of the first dielectric layer 12. The first electrode 14 can be formed of any suitable conductive material, such as titanium nitride (TiN), titanium aluminum nitride (TiAlN), titanium tungsten (TiW), platinum (Pt) or tungsten (W), among others.

The phase change material layer 16 is formed by deposition and patterning of a conformal or a partially conformal phase change material over the first dielectric layer 12. The deposited phase change material could be a chalcogenide material, such as, for example, germanium-antimony-tellurium or germanium-telluride layer. The phase change materials could also include other phase change materials such as, for example, GeTe, In—Se, Sb2Te3, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt.

The phase change material layer 16 could be patterned to have a substantially disk like top down shape (see FIG. 3B) having sloped sidewall regions 16*b* to improve the step coverage of the material element deposition, discussed below. It should be noted that the sloped sidewalls 16*b* are optional, and that the sidewalls 16*b* of the phase change material layer 16 could be vertical relative to a top surface of the first electrode 14, linear, non-linear, bowed, sloped such that a top surface of the phase change material layer 16 has a greater surface area than that of a bottom surface, or any other desired shape. The phase change material layer 16 could have a metal layer over the top for better electrical contact.

Figure 4A:
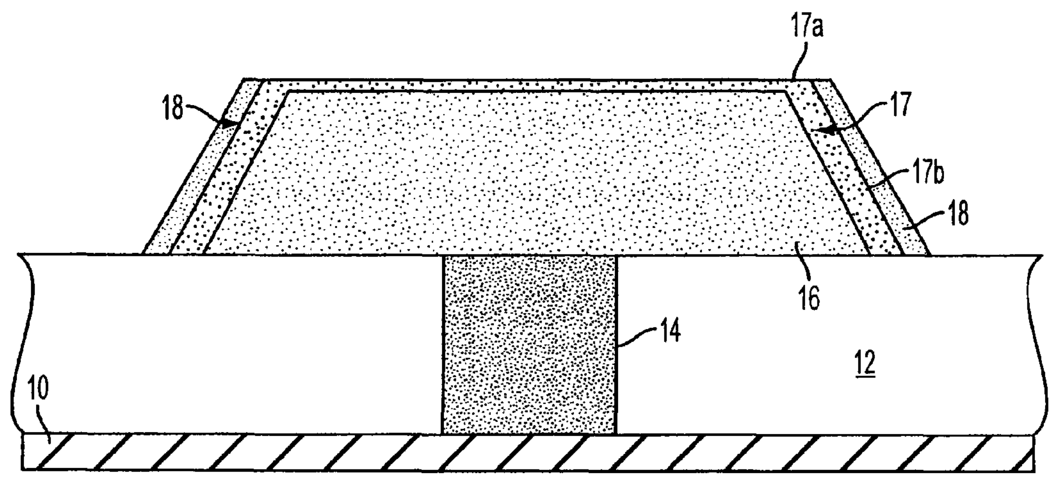
Figure 4B:
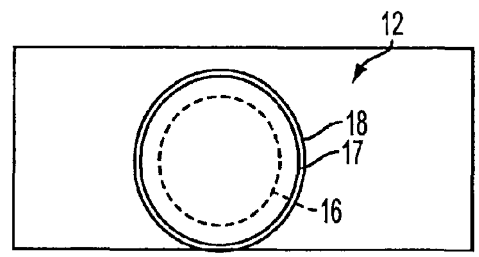

A material element 17 is formed on an upper surface 16*a* and sidewall regions 16*b* of the phase change material layer 16. The material element 17 self-aligns over the surfaces of the phase change material layer 16 when deposited. The self-alignment over the phase change material layer 16 ensures that the phase change material layer 16 is electrically isolated from the subsequently deposited energy conversion layer 18 (FIGS. 4A and 4B). The self-alignment of the material layer 17 with the phase change material layer 16 may simplify the processing and fabrication of the overall phase change memory element 100 (FIGS. 2A and 2B), and may also increase throughput. The material element 17 could be formed of any insulating material such as, but limited to, silicon nitrides; alumina oxides; oxides; high temperature polymers; low dielectric constant materials; insulating glass; or insulating polymers.

FIGS. 4A and 4B illustrate a further step in the fabrication of the phase change memory element 100 illustrated in FIGS. 2A and 2B. As illustrated, the energy conversion layer 18 is formed on sidewall regions 17*b* of the material element 17. The energy conversion layer 18 self-aligns over the sidewall regions 17*b* of the material layer 17 when deposited. The self-alignment over the material layer 17 simplifies the processing and fabrication of the overall phase change memory element 100 (FIGS. 2A and 2B), and also increases fabrication throughput.

The energy conversion layer can be formed of any material with relatively high resistivity and that can withstand high temperature, such as refractory metal nitride, carbide, and Boride. For example, the energy conversion layer could be formed of a material selected from TiN, ZrN, HfN, VN, NbN, TaN, TiC, ZrC, HfC, VC, NbC, TaC, TiB2, ZrB2, HfB2, VB2, NbB2, TaB2, Cr3C2, Mo2C, WC, CrB2, Mo2B5, W2B5, TiAlN, TaSiN, TiCN, SiC, B4C, WSix, MoSi2, doped silicon, carbon, Niobium, Tungsten, molybdenum, or metal alloys NiCr.

Although the energy conversion layer 18 is not formed over an upper surface 17*a* of the material element 17, it is not limiting in any way. For example, the energy conversion layer 18 could be formed over the upper surface 17*a* of the material element 17; the energy conversion layer 18, however, should be electrically isolated from the phase change material layer 16 and the second electrode 22 (FIGS. 2A and 2B) for proper operation. A portion of the material layer 17 is subsequently etched such that the subsequently formed second electrode 22 (FIGS. 5A and 5B) is in electrical connection with the phase change material layer 16.

Figure 5A:
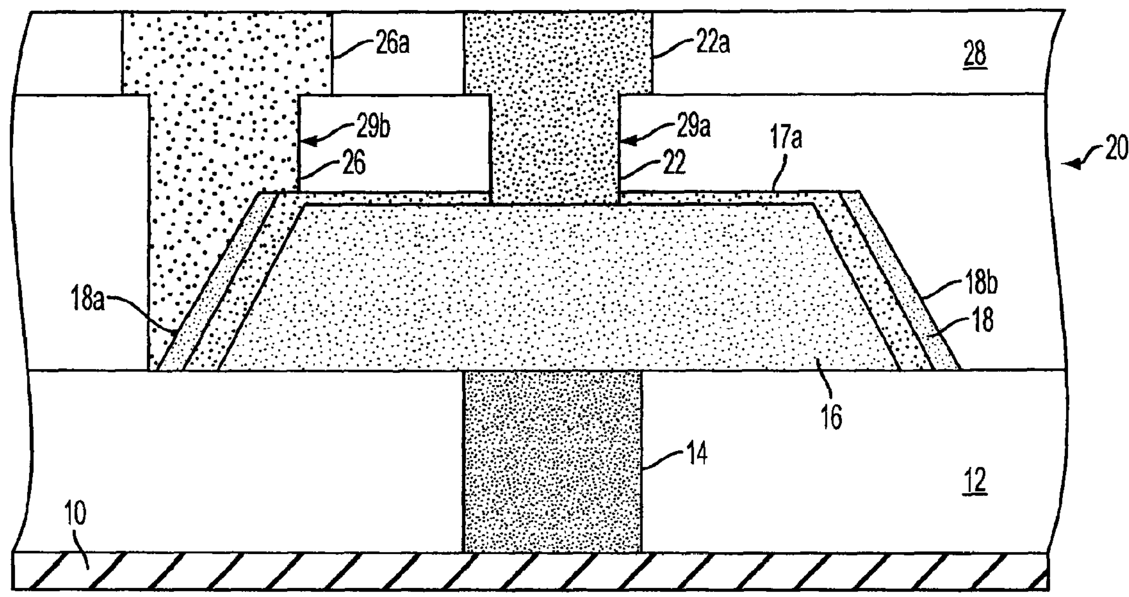
Figure 5B:
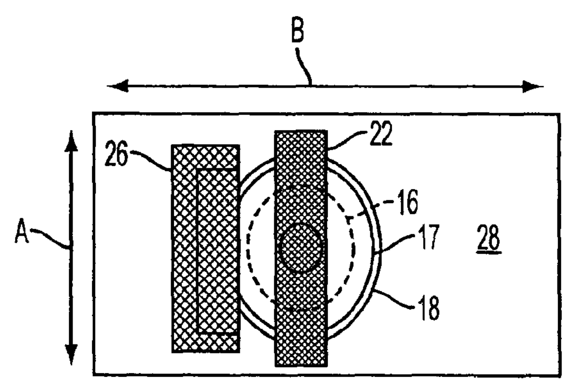

FIGS. 5A and 5B illustrate the deposition of the second dielectric layer 20 over the upper surface 17*a* of the material element 17 and the first and second regions 18*a*, 18*b* of the energy conversion layer 18. The second dielectric layer 20 is subsequently etched to create first and second vias 29*a*, 29*b* therein. A portion of the upper surface 17*a* of the material element 17 above the phase change material layer 16 is also removed such that the first via 29*a* extends to the phase change material layer 16. Second and third electrodes 22, 26 fill the first and second vias 29*a*, 29*b* formed within the second dielectric layer 20. The second electrode 22 is formed such that it extends to the phase change material layer 16 and, thereby, in electrical communication with the phase change material layer 16. The second and third electrodes 22, 26 can be formed of any suitable conductive material, such as titanium nitride (TiN), titanium aluminum nitride (TiAlN), titanium tungsten (TiW), platinum (Pt) or tungsten (W), among others.

The second via 29*b* is formed to extend to the first portion 18*a* of the energy conversion layer 18. The third electrode 26 is formed within the second via 29*b* to extend to the first portion 18*a* of the energy conversion layer 18 such that the third electrode 26 is in electrical communication with the first portion 18*a* of the energy conversion layer 18. A third dielectric layer 28 is formed over the second dielectric layer 20. Contacts 22*a*, 26*a* are formed within the third dielectric layer 28 as part of the second and third electrodes 22, 26, respectively. The contacts 22*a*, 26*a* are formed to extend in the first direction A, which is substantially perpendicular to the second direction B. The contacts 22*a*, 26*a* allow electrical communication to peripheral circuitry, including transistors that are activated for either read and/or write operations of the phase change memory element 100 (FIGS. 2A and 2B), as discussed below with respect to FIG. 7.

Figure 6A:
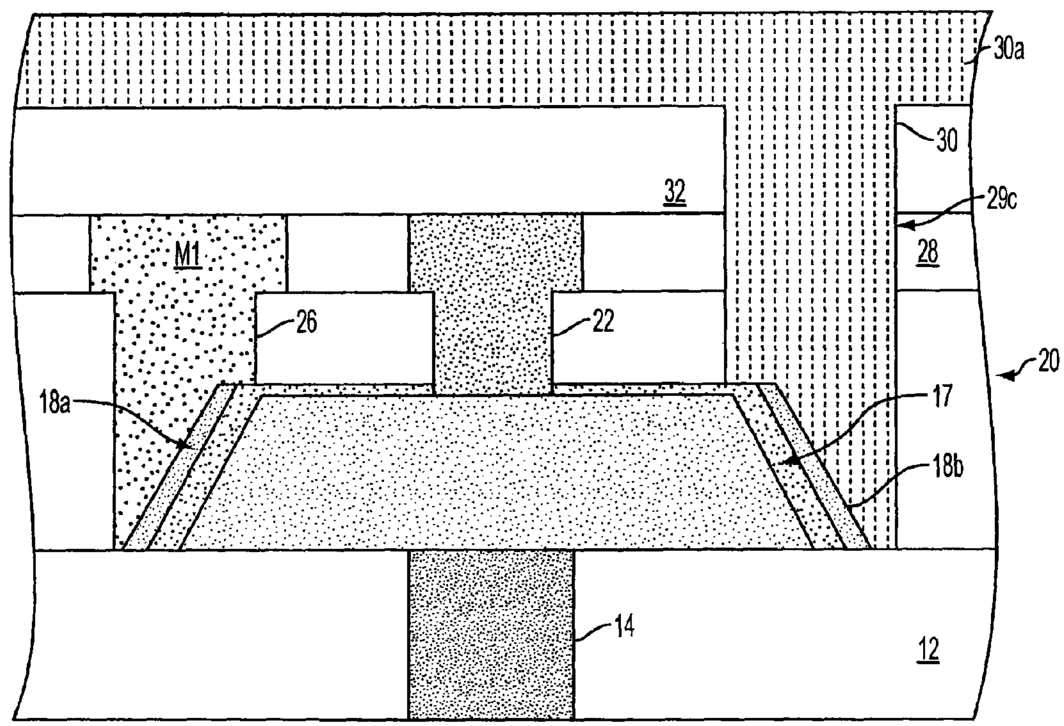
Figure 6B:
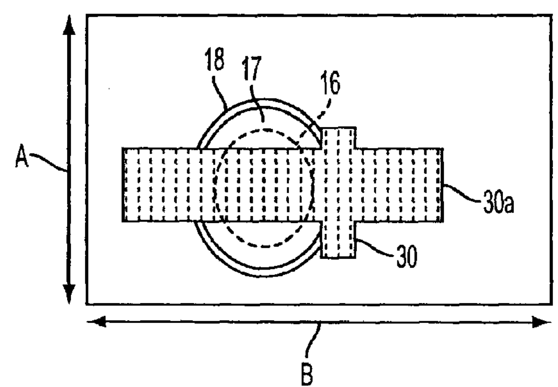

FIGS. 6A and 6B illustrate the deposition of the fourth dielectric layer 32 over the third dielectric layer 28. The third via 29*c* is formed to extend from an upper surface of the fourth dielectric layer 30 to the second portion 18*b* of the energy conversion layer 18. The third via 29*c* is subsequently filled with a conductive material to form the fourth electrode 30. The fourth electrode 30 can be formed of any suitable conductive material, such as titanium nitride (TiN), titanium aluminum nitride (TiAlN), titanium tungsten (TiW), platinum (Pt) or tungsten (W), among others. The fourth electrode 30 should be formed to be electrically isolated from the first, second, and third electrodes 14, 22, 26, and should be in electrical communication with the second portion 18*b* of the energy conversion layer 18. As illustrated, a metal line 30*a* is formed over the fourth dielectric layer 32, and is in electrical communication with the fourth electrode 30. The metal line 30*a* is formed to extend in the second direction B, which is substantially perpendicular to the first direction A. The metal line 30*a* allows electrical communication to peripheral circuitry, including a transistor that is activated for the write operations of the phase change memory element 100 (FIGS. 2A and 2B), as discussed below with respect to FIG. 7.

Figure 7:
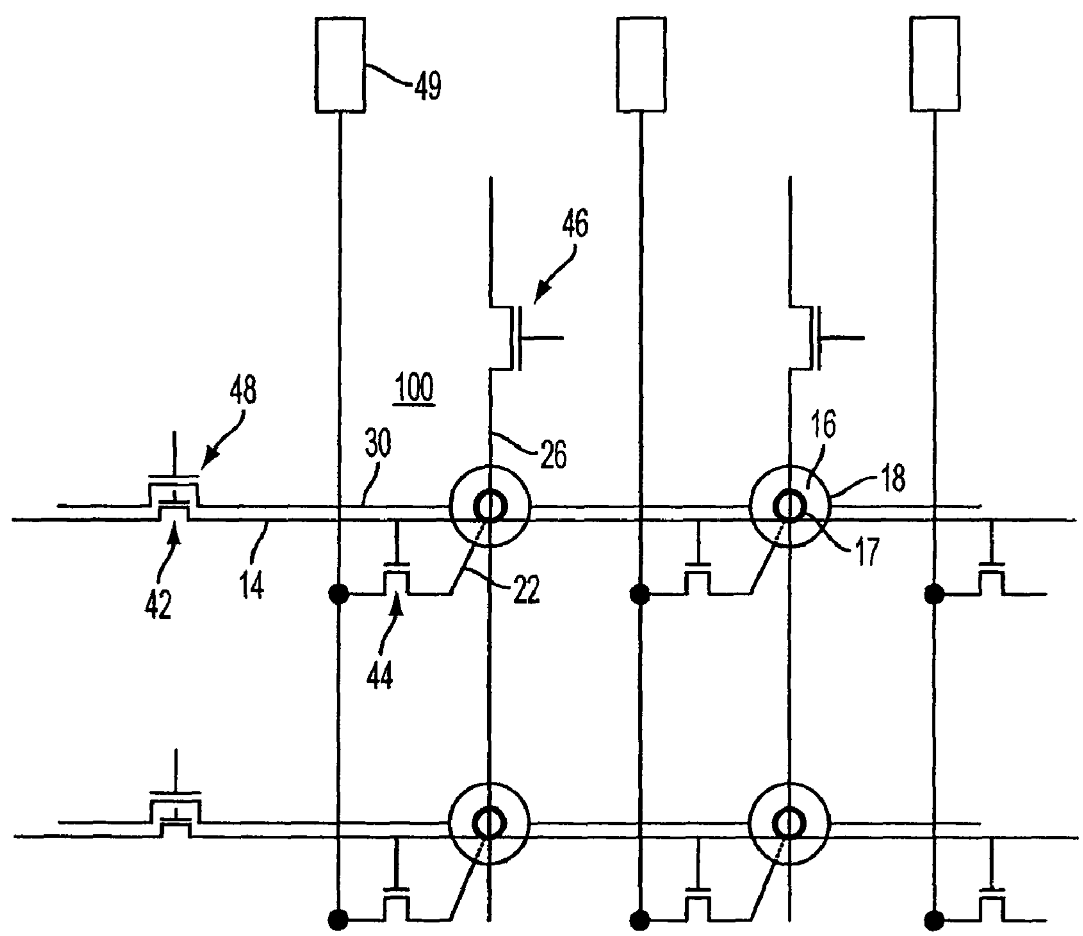
FIG. 7 illustrates a partial schematic view of an array of the embodiment of the phase change memory element illustrated in FIGS. 2A and 2B.

FIG. 7 illustrates a partial top-down view of an array of phase change memory elements 100 (illustrated in detail in FIGS. 2A and 2B). The first, second, third, and fourth electrodes 14, 22, 26, 30 are illustrated schematically, as are first, second, third, and fourth transistors 42, 44, 46, 48, respectively; only the phase change material layer 16, material element 17, and energy conversion layer 18 of the phase change memory element 100 are illustrated, for the sake of clarity. In the read operation of the phase change memory element 100, the first transistor 42 is activated to allow current to pass through the first electrode 14 and the phase change material layer 16; the second transistor 44 is also activated to allow the current to pass from the phase change material layer 16 through the second electrode 22, and the resistance level of the phase change material layer 16 is read out to a sense amplifier 49, which senses the signal associated with the resistance of the phase change cell 100.

In the write and/or erase operation, the third transistor 46 is activated to allow current to pass through the third electrode 26 and the first portion 18*a* (FIG. 2A) of the energy conversion layer 18. The current is allowed to pass from the first portion 18*a* (FIG. 2A) of the energy conversion layer 18 to the second portion 18*b* (FIG. 2A) of the energy conversion layer 18. The current flows through the fourth electrode 30 when the fourth transistor 48 is activated. The current flowing from the third electrode 26 through the energy conversion layer 18 and out through the fourth electrode 30 heats up the energy conversion layer 18, which can change the phase of the phase change material layer 16 formed within the energy conversion layer 18.

As discussed above with respect to FIGS. 2A and 2B, the current that flows through the phase change material layer 16 is substantially reduced for programming (phase change) operations in comparison to conventional phase change memory elements (e.g., phase change memory element 1 of FIGS. 1A and 1B), which is desired.

Figure 8:
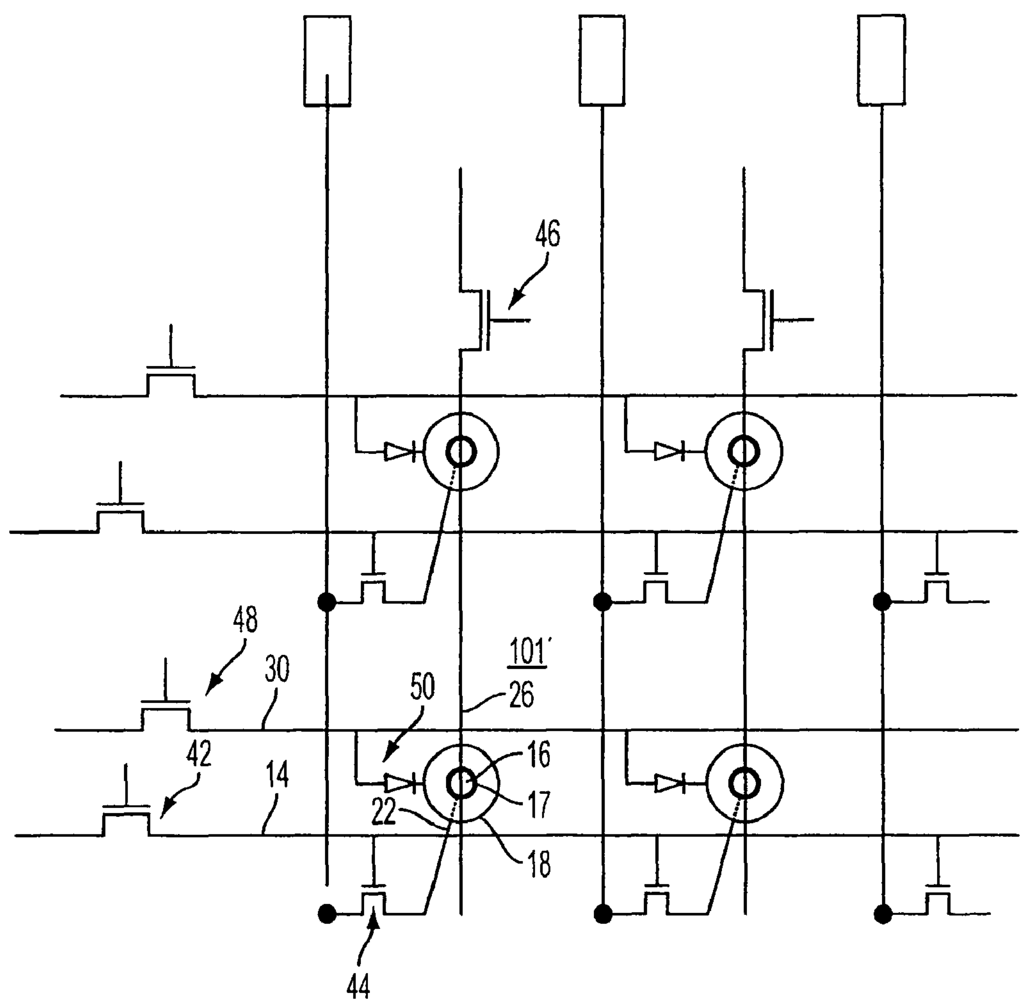
FIG. 8 a partial schematic view of an array of the phase change memory element in accordance with a second embodiment of the invention.

FIG. 8 illustrates a partial top-down view of an array of phase change memory elements 100' constructed in accordance with a second embodiment of the invention. The FIG. 8 phase change memory element 100' includes the components of phase change memory element 100 (FIG. 7) with the addition of a diode 50 (schematically illustrated) between the fourth electrode and the energy conversion layer 18. The diode 50 serves to further isolate the energy conversion layer 18 from adjacent phase change memory elements 100'.

Figures 9A, 9B:
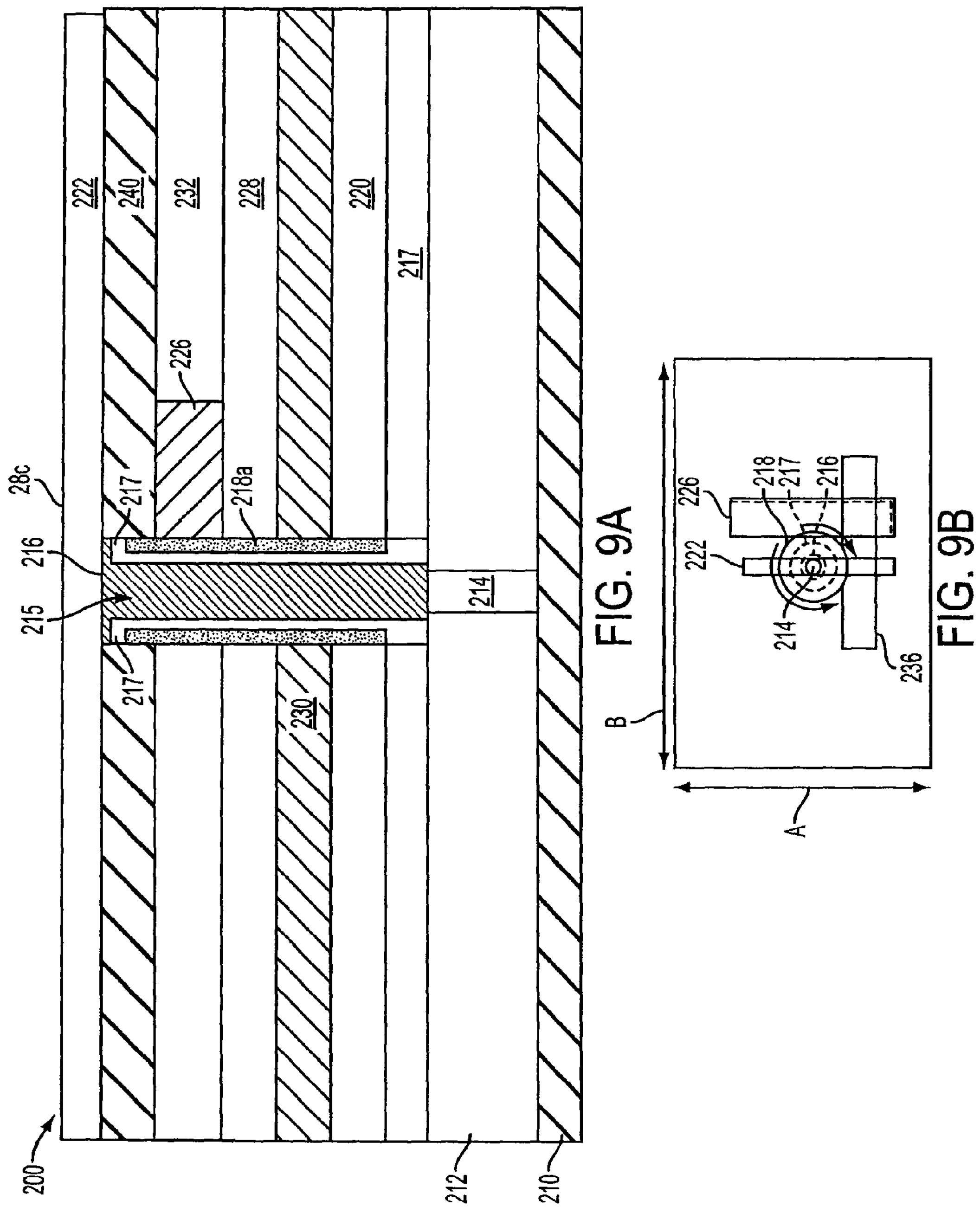
FIGS. 9A-9B illustrate partial cross-sectional and partial top-down views, respectively, of a phase change memory element constructed in accordance with a third embodiment of the invention.

FIGS. 9A and 9B illustrate a partial cross-sectional view and a partial top-down view, respectively, of a phase change memory element 200 constructed in accordance with another embodiment of the invention. The phase change memory element 200 is substantially similar to the phase change memory element 100 illustrated in FIGS. 2A and 2B; the components contained therein, however, have a different configuration within the phase change memory element 200.

The phase change memory element 200 includes a substrate 210 and a first dielectric layer 212 having a first electrode 214 formed therein. An insulating material element 217 is formed over the first dielectric layer 212. A second dielectric layer 220, a second electrode 230, a third dielectric layer 228, a fourth dielectric layer 232 having a third electrode 226 formed therein, and a fifth dielectric layer 240 are all formed over the insulating material element 217 (at different levels of processing). A fourth electrode 222 is formed over the fifth dielectric layer 240.

A phase change material layer 216, a portion of the material element 217, and a energy conversion layer 218 are all contained within a via 215 such that the phase change material layer 216 is in electrical communication with both the first and fourth electrodes 214, 222. The energy conversion layer 218 surrounds the phase change material layer 216 in the via 215, and portions of the insulating material element 217 electrically isolate the energy conversion layer 218 and the phase change material layer 216.

FIGS. 10A-14 illustrate a method of fabricating the phase change memory element 200 illustrated in FIGS. 9A and 9B. No particular order is required for any of the actions described herein, except for those logically requiring the results of prior actions. Accordingly, while the actions below are described as being performed in a specific order, the order is an example only and can be altered if desired. Although the formation of a single phase change memory element 200 is shown, it should be appreciated that the phase change memory element 200 can be one memory element in an array of memory elements, which can be formed concurrently.

Figure 10A:
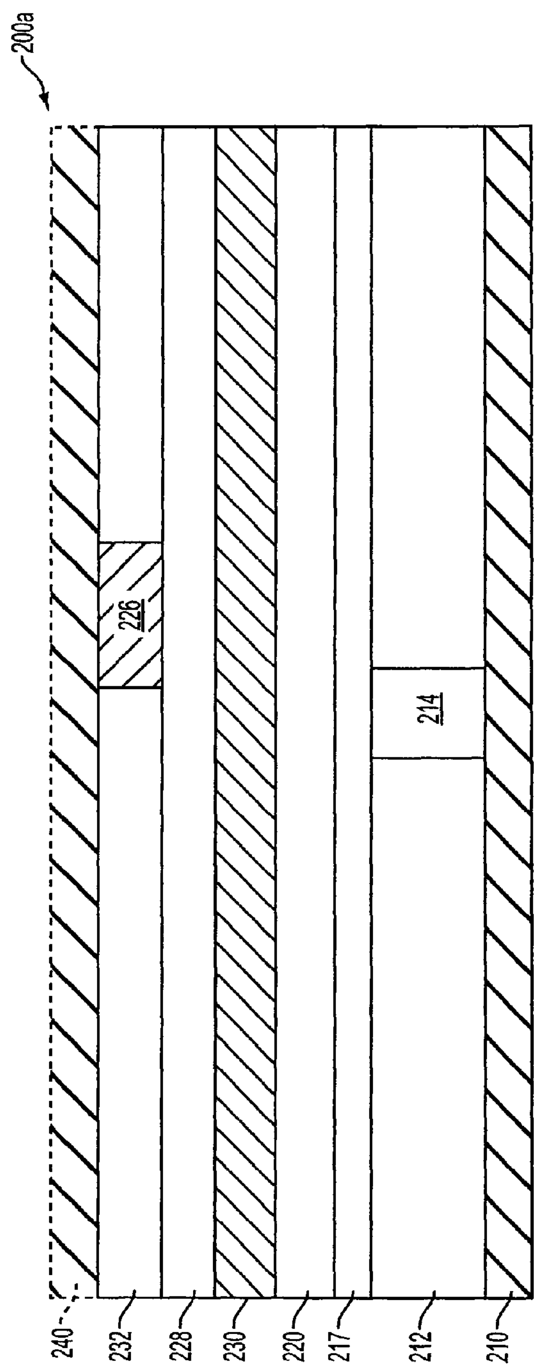
FIGS. 10A-14 illustrate partial cross-sectional and partial top-down views of an embodiment of a method of fabricating the phase change memory element of FIGS. 9A and 9B.
Figure 10B:
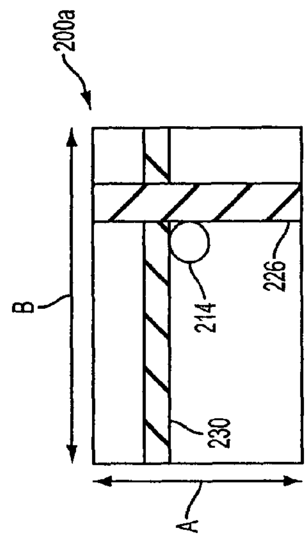

FIGS. 10A and 10B illustrate partial cross-sectional and top-down views of an intermediate structure 200*a*. The intermediate structure 200*a* is formed by forming the first dielectric layer 212 over the substrate 210, and subsequently forming the first electrode 214 within the first dielectric layer 212. The material element 217, second dielectric layer 220, second electrode 230, third dielectric layer 228, and fourth dielectric layer 232 are successively deposited over the first dielectric layer 212 (at different levels of processing). The fourth dielectric layer 232 is etched to create trench within which the third electrode 226 is formed. A fifth dielectric layer 240 is formed over the fourth dielectric layer 232 after the third electrode 226 is deposited.

The second and third electrodes 230, 226 are formed substantially perpendicular to one another, as illustrated in FIG. 10B. The illustrated third electrode 226 extends in a first direction A; whereas the second electrode 230 extends in a second direction B.

Figure 11:
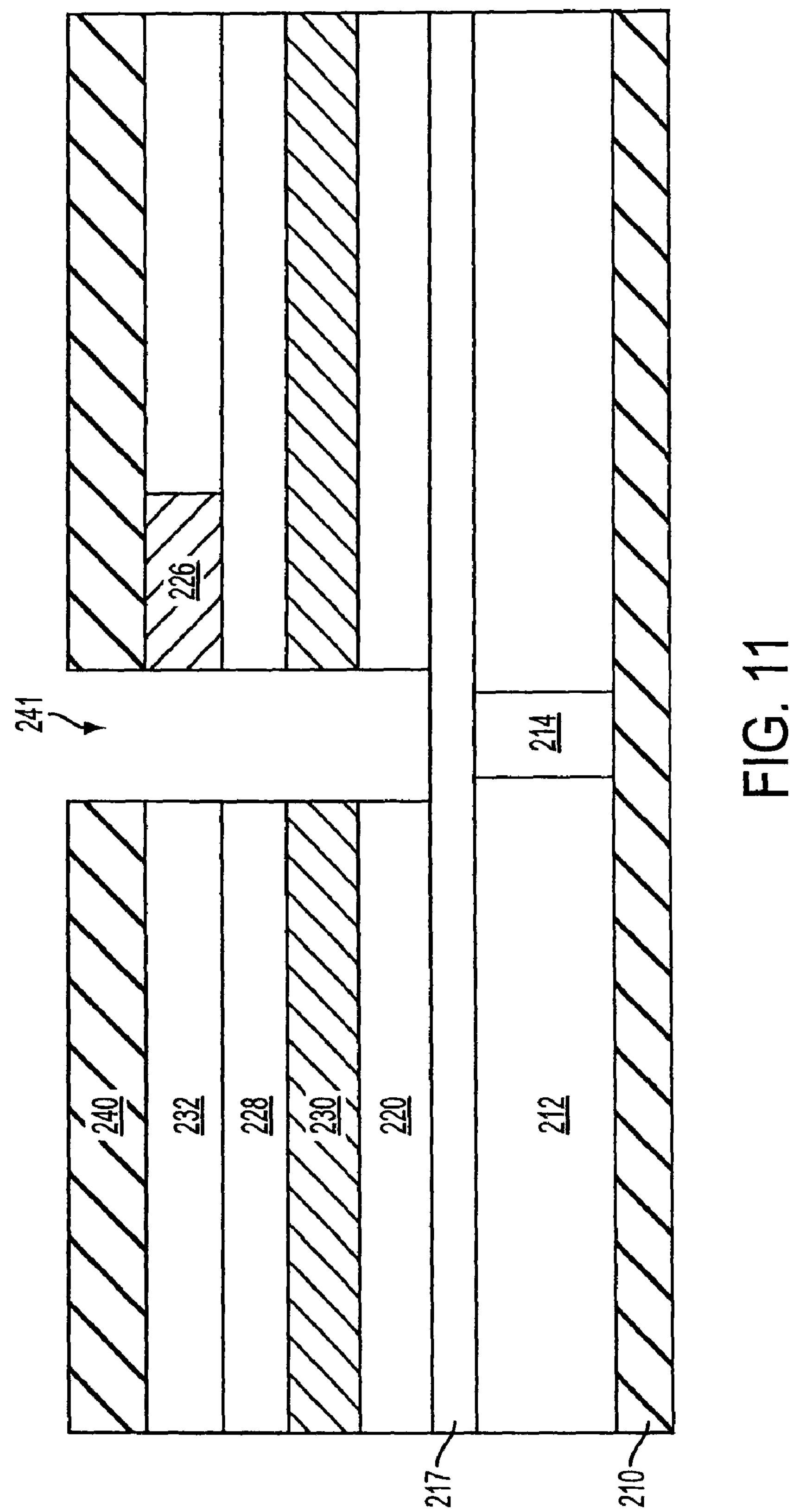

FIG. 11 illustrates a cross-sectional view of the FIG. 10A intermediate structure 200*a* subsequent to having a via 241 formed therein; the via 241 is formed such that portions of the material element 217, the first electrode 214 and each of the second and third electrodes 230, 226 are exposed within the via 241.

Figure 12:
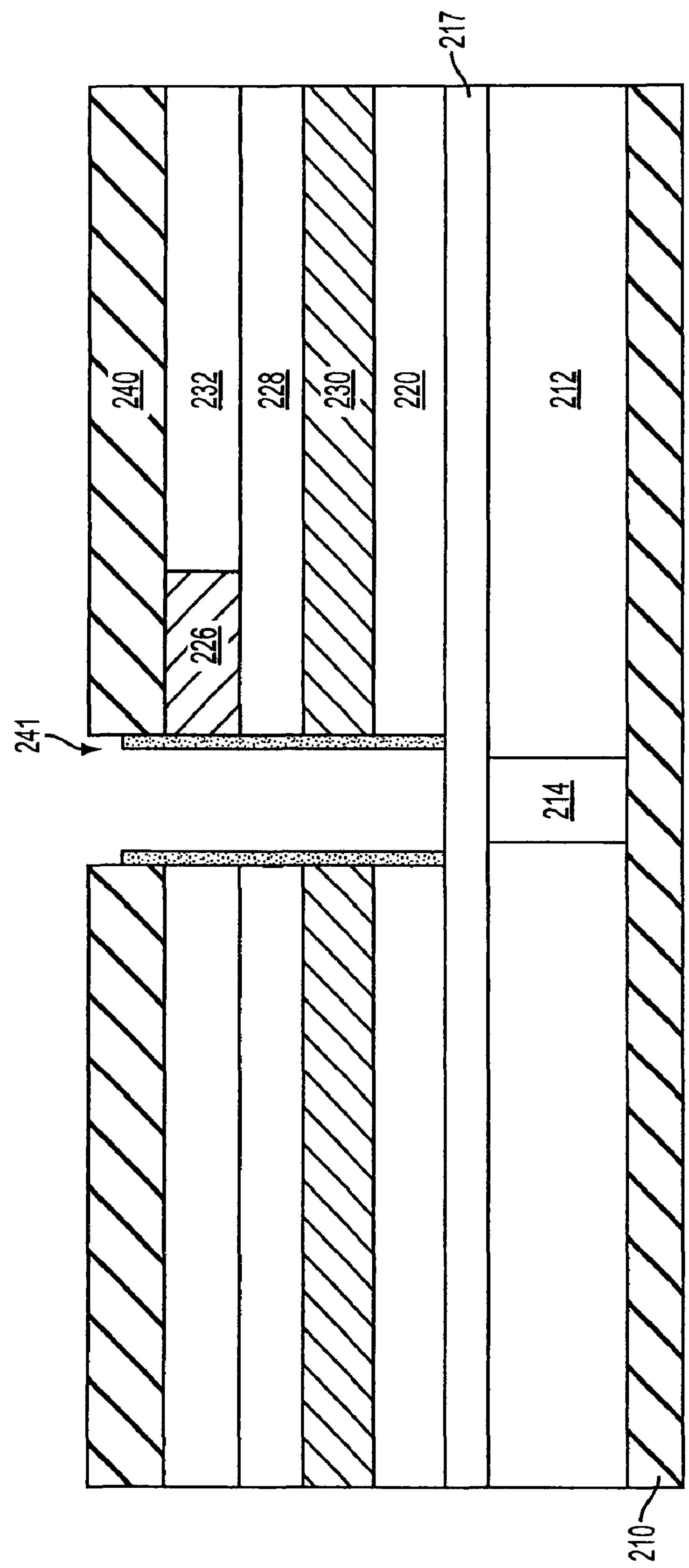

FIG. 12 illustrates the deposition of the energy conversion layer 218 over the sidewall portions of the via 241. The energy conversion layer 218 self-aligns with the sidewall portions of the via 241. The self-alignment may reduce fabrication costs, and increase throughput.

Figure 13:
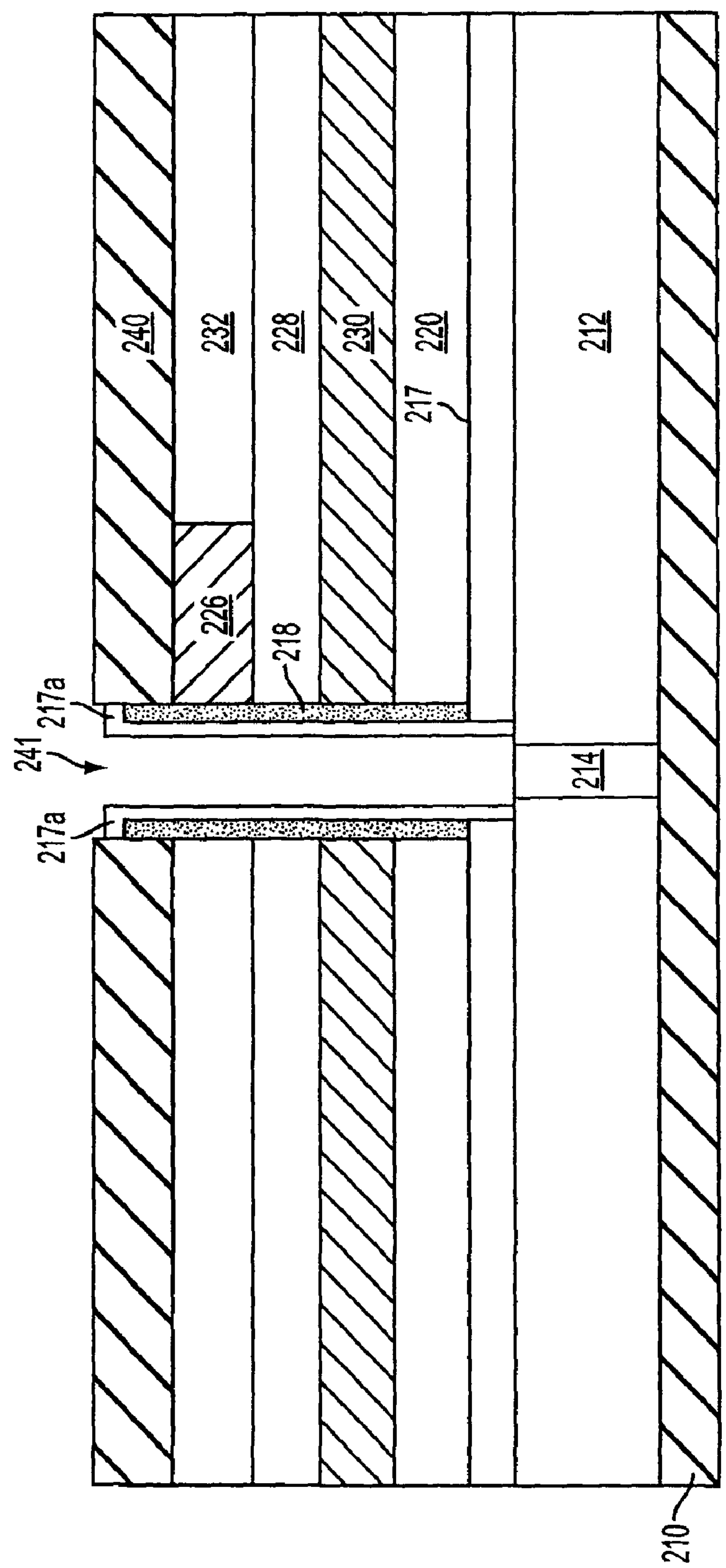

FIG. 13 illustrates a further etching step removing a portion of the exposed material element 217 to extend the via 241 to the first electrode 214, and the deposition of additional material elements 217*a* that self-aligns with the energy conversion layer 218. The material elements 217*a* also encapsulate the energy conversion layer 218 previously formed on the sidewall regions of the via 241.

Figure 14:
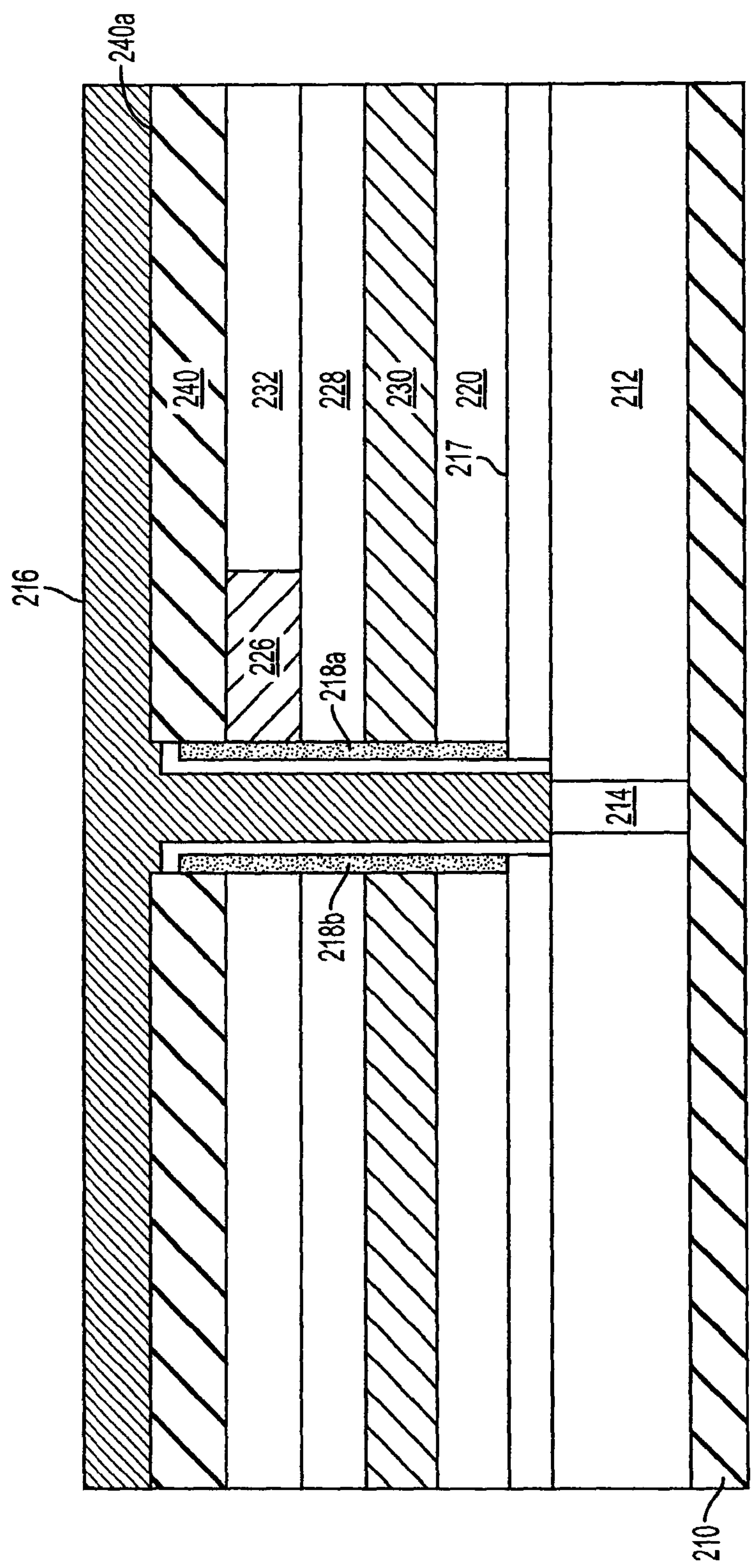

FIG. 14 illustrates the deposition of the phase change material layer 216 within the via 241 (FIG. 13) and over a surface 240*a* of the fifth dielectric layer 240. The phase change material layer 216 is deposited over the sidewall regions of the insulating material element 217 within the via 241 (FIG. 13), and in electrical communication with the first electrode 214 formed within the first dielectric layer 212. The phase change material layer 216 self-aligns with the first electrode 214. The phase change material layer 216 over the surface 240*a* of the fifth dielectric layer 240 is planarized, and a fourth electrode 222 (FIG. 9A) is deposited over the fifth dielectric layer 240 such that the fourth electrode 222 (FIG. 9A) is in electrical communication with the phase change material layer 216.

Referring again to FIGS. 9A and 9B, the phase change memory element 200 operates in a substantially similar way as the phase change memory element 100 illustrated in FIGS. 2A and 2B. During the read operation of the phase change memory element 200, transistors in the periphery that are electrically coupled to the first and fourth electrodes 214, 222 are simultaneously turned on, and the resistive property of the phase change material layer 216 is read. For example, a high resistance (corresponding to an amorphous state of the phase change material layer 216) may represent a data value of "1." Conversely, a low resistance (corresponding to a crystalline state of the phase change material layer 16) may represent a data value of "0." The information is read out to peripheral circuitry, as discussed above with respect to FIG. 7.

During the write operation of the phase change memory element 200, the second and third electrodes 230, 226 work in conjunction with one another to switch the state of the phase change material layer 216 from amorphous to crystalline or vice versa. In operation, transistors in the periphery that are electrically coupled to the second and third electrodes 230, 226 are turned on to allow current to flow through the energy conversion layer 218 (as indicated by the arrows in FIG. 9B), which heats the phase change material layer 216 to switch its state.

Figure 15:
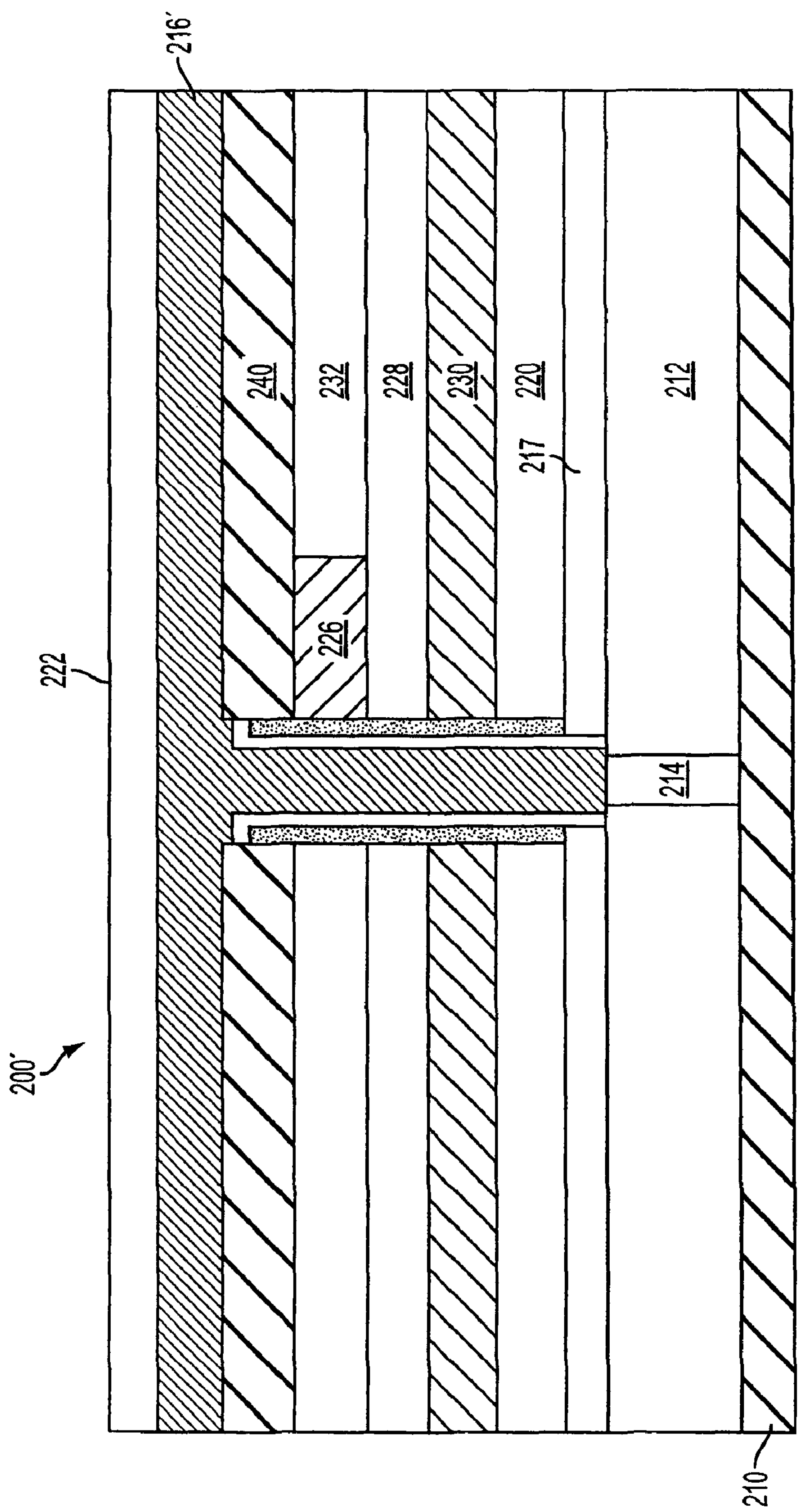
FIG. 15 illustrates a partial cross-sectional view of a phase change memory element constructed in accordance with a fourth embodiment of the invention.

It should be noted that the phase change material layer 216 need not be planarized prior to the deposition of the fourth electrode 222 (FIG. 9A). For example, FIG. 15 illustrates a phase change memory element 200' constructed in accordance with another embodiment of the invention. As illustrated, phase change material layer 216' is formed within the via 241 (FIG. 12), and over the sidewall regions of the insulating material element 217 within the via 241 (FIG. 11) and the surface 240*a* (FIG. 14) of the fifth dielectric layer 240. The fourth electrode 222 is deposited over the phase change material layer 216'. The operation of the FIG. 15 phase change memory element 200' is substantially similar to the operation of the phase change memory element 200.

Figure 16A:
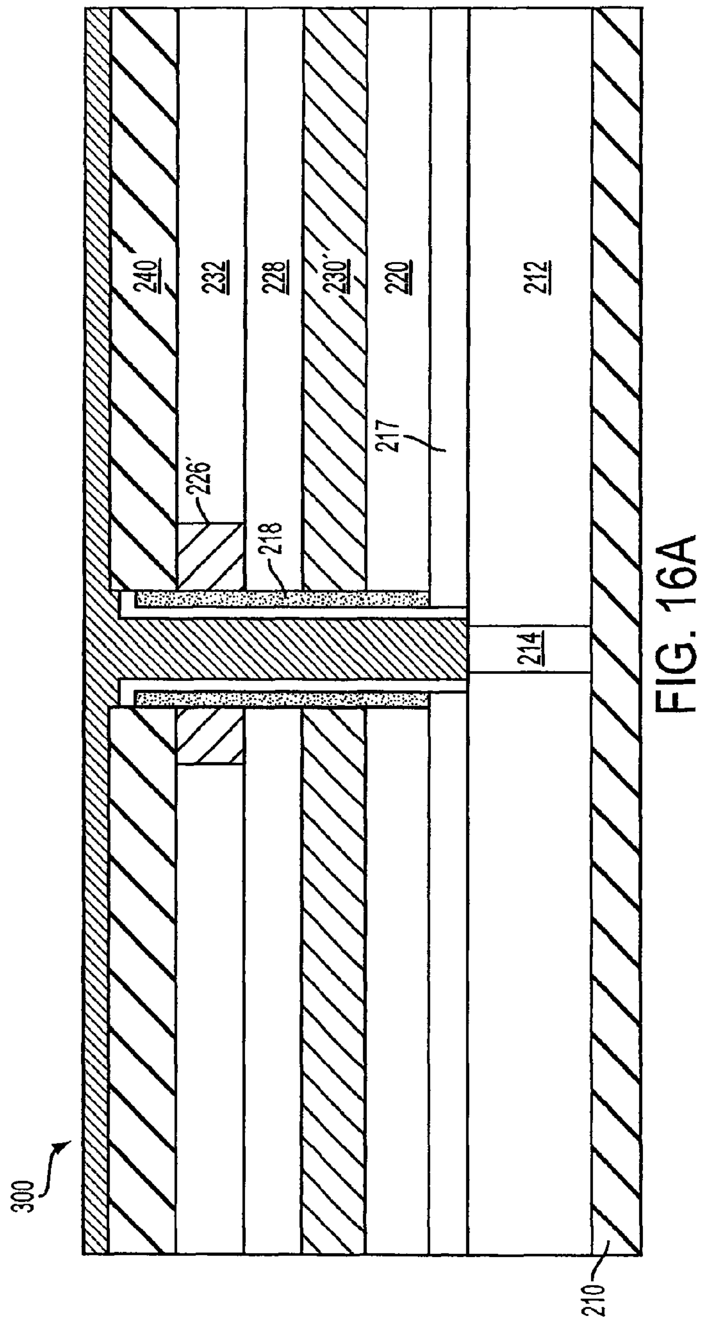
FIGS. 16A-16B illustrate partial cross-sectional and partial top-down views, respectively, of a phase change memory element constructed in accordance with a fifth embodiment of the invention.
Figure 16B:
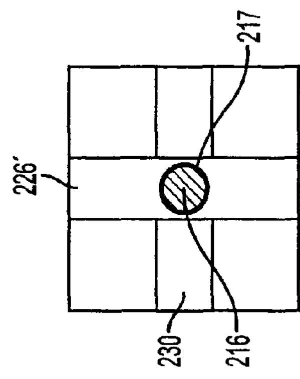

FIGS. 16A and 16B illustrate a phase change memory element 300 constructed in accordance with another embodiment of the invention. The phase change memory element 300 is substantially similar to the phase change memory element illustrated in FIGS. 9A and 9B; the phase change memory element 300, however, has the energy conversion layer 218, material element 217, and phase change material layer 216 formed within a via 241 (FIG. 11) located within the second and third electrodes 230', 226', respectively. The placement of the energy conversion layer 218 within the second and third electrodes 230', 226', may increase the efficiency by which the current passes through the energy conversion layer 218, which may reduce the power consumption necessary for the write/erase operation of the phase change memory element 300.

Figure 17A:
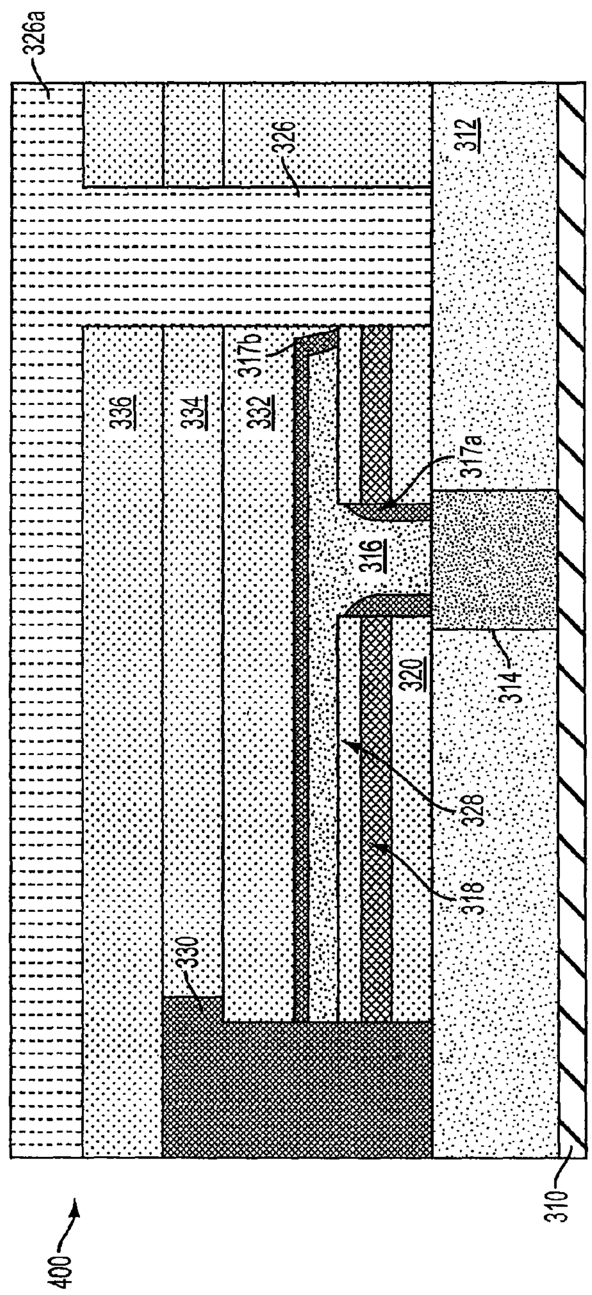
FIGS. 17A-17B illustrate partial cross-sectional and partial top-down views, respectively, of a phase change memory element constructed in accordance with a sixth embodiment of the invention.
Figure 17B:
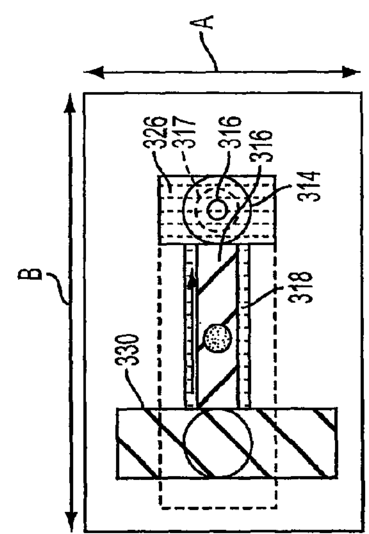

FIGS. 17A and 17B illustrate a phase change memory element 400 constructed in accordance with yet another embodiment of the invention. The phase change memory element 400 includes a phase change material layer 316 and first, second, and third electrodes 314, 330, 326. Other material layers within the phase change memory element 400 include first and second insulating material layers 317*a*, 317*b*, which electrically isolate the phase change material layer 316 from a energy conversion layer 318, and electrically isolate the phase change material layer 316 from a third electrode 326, respectively. The phase change memory element 400 is fabricated on a first dielectric layer 312 formed over a substrate 310. The first electrode 314 is formed within the first dielectric layer 312. Second and third dielectric layers 320, 328 are also provided as insulating layers between the first electrode 314 and the energy conversion layer 318, and the energy conversion layer 318 and the phase change material layer 316, respectively.

A via is formed within the energy conversion layer 318 and second and third dielectric layers 320, 328, which extends to the first electrode 314. The first insulating material layer 317*a* is formed on sidewall portions of the via extending to the first electrode 314. The phase change material layer 316 is subsequently formed between the first insulating material layer 317*a* formed in the via such that it is in electrical communication with the first electrode 314. The phase change material layer 316 is also patterned over a surface of the third dielectric layer 328 such that it is in electrical communication with the second electrode 330.

The second insulating layer 317*b* is formed over the patterned phase change material layer 316 and a portion of the third dielectric material layer 328 not covered by the phase change material layer 316. Fourth, fifth, and sixth dielectric layers 332, 334, 336 are formed over the second insulating layer 317*b* and portions of the third dielectric layer not covered by the second insulating layer 317*b*. Previous to the formation of the fifth and sixth dielectric material layers 334, 336, the second electrode 330 is formed within a via created in the fourth dielectric layer 332, second insulating layer 317*b*, phase change material layer 316, third dielectric layer 328, energy conversion layer 318, and the second dielectric material layer 320.

The second electrode 330 is thereby formed in electrical communication with the energy conversion layer 318 and the phase change material layer 316. The second electrode 330 is formed to extend in a first direction A (FIG. 17B), which is coupled to peripheral circuitry as discussed below with respect to FIG. 18. Subsequent to the formation of the second electrode 330 and the fifth and sixth dielectric material layers 334, 336, the third electrode 326 is formed within a via extending from an upper surface of the sixth dielectric material layer 336 to the first dielectric material layer 312. The third electrode 326 is formed to be in electrical communication with the energy conversion layer 318. The third electrode 326 is coupled to a metal line 326*a* that extends in a second direction B (FIG. 17B) that is substantially perpendicular to the first direction A; the metal line 326*a* is coupled to peripheral circuitry as discussed below with respect to FIG. 18.

During the read operation of the phase change memory element 400, transistors in the periphery that are electrically coupled to the first and second electrodes 314, 330 are simultaneously turned on, and the resistive property of a phase change material layer 316 is read. For example, a high resistance (corresponding to an amorphous state of the phase change material layer 316) may represent a data value of "1." Conversely, a low resistance (corresponding to a crystalline state of the phase change material layer 316) may represent a data value of "0." The information is read out to peripheral circuitry, as discussed above with respect to FIG. 7.

During the write/erase operation of the phase change memory element 400, the second and third electrodes 330, 326 work in conjunction with one another to switch the state of the phase change material layer 316 from amorphous to crystalline or vice versa. In operation, transistors in the periphery that are electrically coupled to the second and third electrodes 330, 326 are turned on to allow current to flow through a energy conversion layer 318, which heats the phase change material layer 316 to switch its state.

The difference between the phase change memory element 400 illustrated in FIGS. 17A and 17B and those discussed above (i.e., FIGS. 2A-16B), is that the gates of the transistors in the periphery corresponding to the first and third electrodes 314, 326 have different applied voltages, thereby having two different currents applied to the energy conversion layer 318 and the phase change material layer 316 when writing or reading. For example, the current passing through the second electrode 330, the energy conversion layer 318, and the third electrode 326 can be regulated by applying a voltage to the gate of a transistor associated with the third electrode 326.

The use of three electrodes 314, 330, 326 decreases the fabrication costs associated with using four electrodes, and further reduces the number of material necessary in the fabrication of the phase change memory element 400.

Figure 18A:
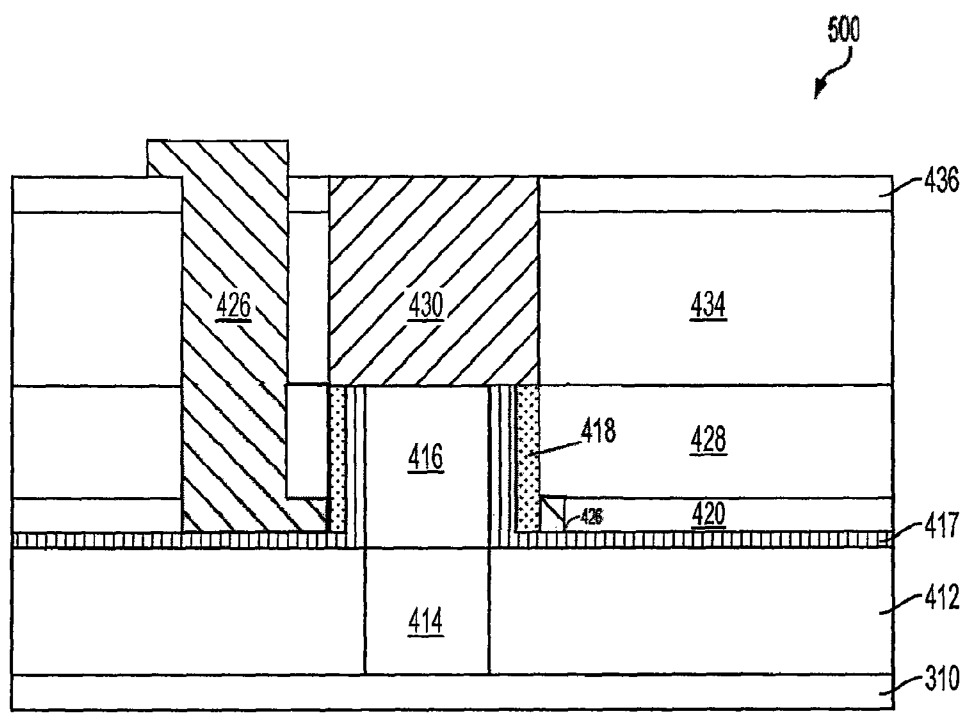
FIGS. 18A-18B illustrate partial cross-sectional and partial top-down views, respectively, of a phase change memory element constructed in accordance with a seventh embodiment of the invention.
Figure 18B:
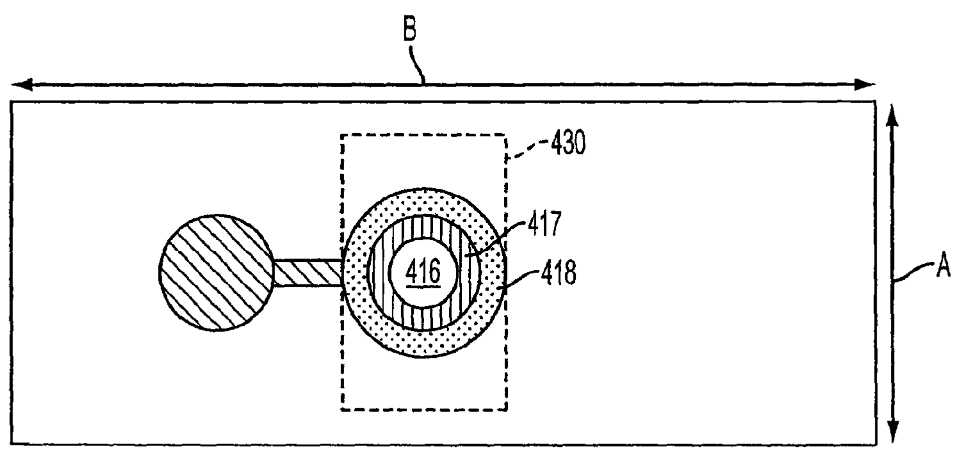

FIGS. 18A and 18B illustrate a phase change memory element 500 constructed in accordance with another embodiment of the invention. The phase change memory element 500 has first, second, and third electrodes 414, 430, 426, respectively. Other material layers within the phase change memory element 500 include an insulating material layer 417, which electrically isolates phase change material layer 416 from energy conversion layer 418, and electrically isolates the phase change material layer 416 from the third electrode 426. The phase change memory element 500 also includes material layers 420, 428, 434, and 436, which are typically interlayer dielectric material layers.

The phase change material layer 416, the insulating material layer 417, and the energy conversion layer 418 are self-aligned with the first electrode 414. The self-alignment may simplify the processing and fabrication of the overall phase change memory element 500.

During the read operation of the phase change memory element 500, transistors in the periphery that are electrically coupled to the first and second electrodes 414, 430 are simultaneously turned on, and the resistive property of a phase change material layer 416 is read. For example, a high resistance (corresponding to an amorphous state of the phase change material layer 416) may represent a data value of "1." Conversely, a low resistance (corresponding to a crystalline state of the phase change material layer 416) may represent a data value of "0." The information is read out to peripheral circuitry, as discussed above with respect to FIG. 7.

During the write/erase operation of the phase change memory element 500, the second and third electrodes 430, 426 work in conjunction with one another to switch the state of the phase change material layer 416 from amorphous to crystalline or vice versa. In operation, transistors in the periphery that are electrically coupled to the second and third electrodes 430, 426 are turned on to allow current to flow through a energy conversion layer 418, which heats the phase change material layer 416 to switch its state.

Although the phase change memory element 500 is substantially similar to the phase change memory element 400 of FIGS. 17A and 17B, the second electrode 430 is placed directly upon the phase change material layer 416, thereby resulting in a more efficient current transfer, and the energy conversion layer 318 surrounds the phase change material layer 316 resulting in more efficient heat transfer. The phase change memory element 500 is formed in substantially the same manner discussed above with respect to FIGS. 2A-6B.

Figure 19A:
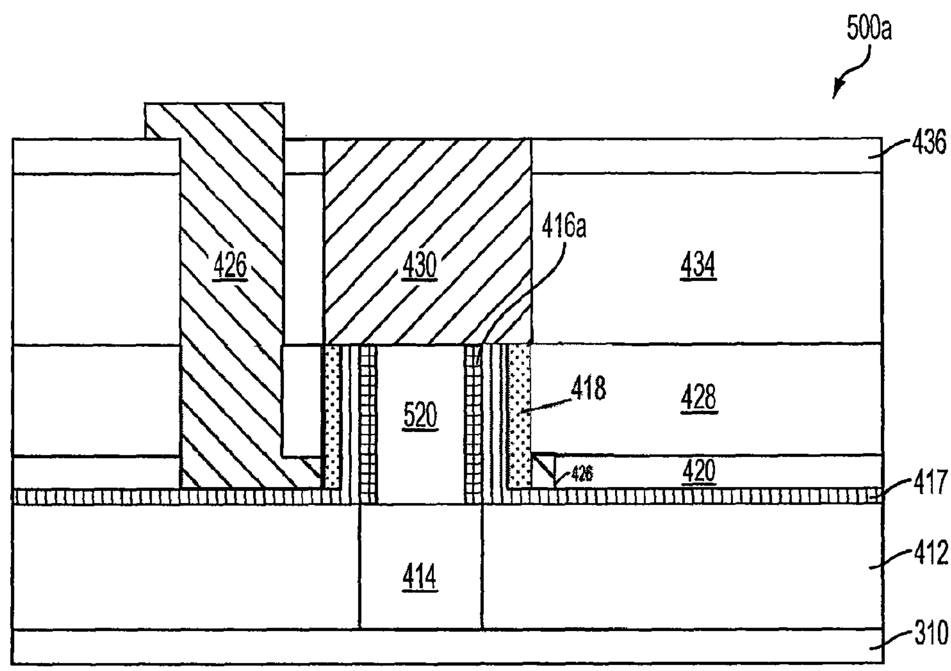
FIGS. 19A-19B illustrate partial cross-sectional and partial top-down views, respectively, of a phase change memory element constructed in accordance with an eighth embodiment of the invention.
Figure 19B:
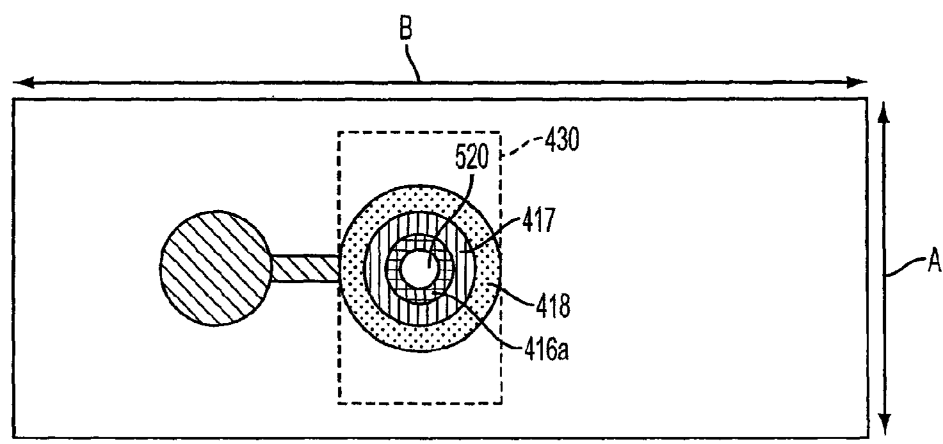

To conserve the amount of phase change material used in the phase change material element 500, a spacer structure 520 could be used as illustrated in FIGS. 19A and 19B. Phase change material element 500*a* is constructed in accordance with yet another embodiment of the invention. The phase change material element 500*a* has a spacer structure 520 that is formed within, and surrounded by, phase change material layer 416*a*. By using the spacer structure 520, the volume of phase change material can be significantly reduced in comparison to the phase change material element 500 illustrated in FIGS. 18A and 18B. Accordingly, the current necessary to change phase of the programmable volume of phase change material layer 416*a* from amorphous to crystalline is decreased due to the decreased volume of phase change material. Another feature of the illustrated phase change material element 500*a* is the reduced contact area between the phase change material layer 416*a* and first and second electrodes 414, 430, which also reduces the current necessary to change phase of the programmable volume of phase change material layer 416*a* from amorphous to crystalline.

The spacer structure 520 is typically formed of a nitride material; the spacer structure, however, could be formed of any insulating material such as, but not limited to, silicon nitrides; alumina oxides; oxides; high temperature polymers; low dielectric materials; insulating glass; or insulating polymers. It should be noted that the illustrated phase change material element 500*a* could have a configuration in which the energy conversion layer 418 and the phase change material layer 416*a* could be switched wherein the energy conversion layer 418 is in electrical contact with the first and second electrodes 414, 430, and the phase change material layer 416*a* is in electrical contact with second and third electrodes 430, 426. In the alternate configuration, the phase change material layer 416*a* would be distal to the spacer structure 520, and the energy conversion layer 418 would be proximal to the spacer structure 520. The alternate configuration could be applied to any of the foregoing and following phase change memory elements of FIGS. 2A-21.

Figure 20A:
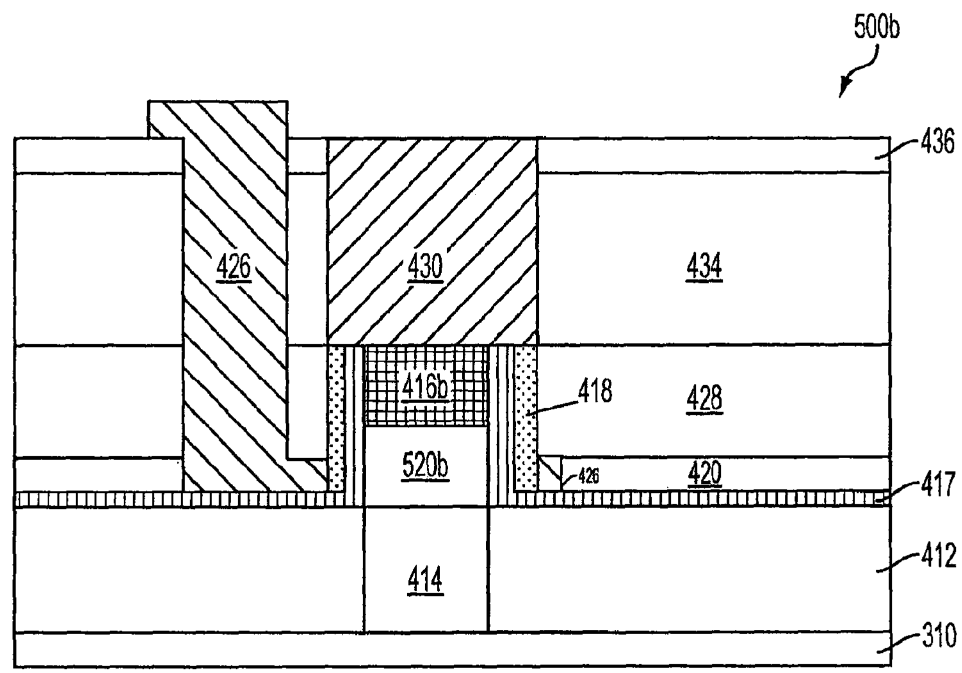
FIGS. 20A-20B illustrate partial cross-sectional and partial top-down views, respectively, of a phase change memory element constructed in accordance with a ninth embodiment of the invention.
Figure 20B:
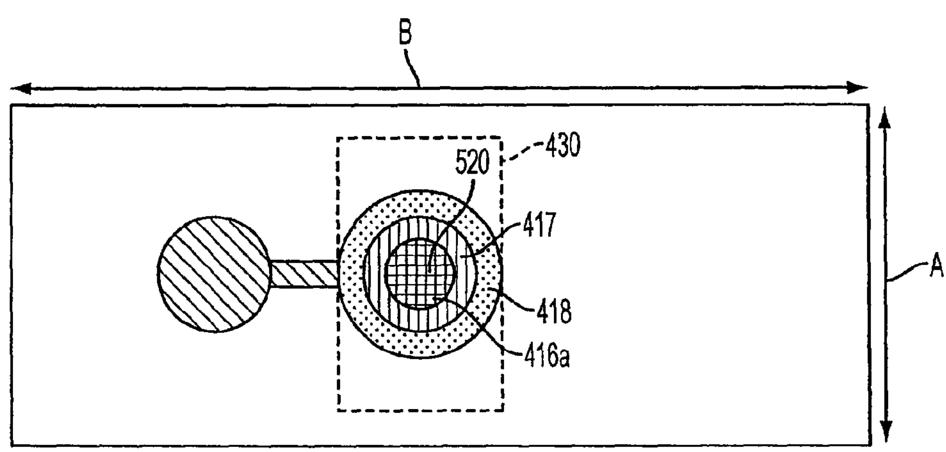

FIGS. 20A and 20B illustrate another embodiment of the of the invention. Phase change memory element 500*b* is substantially similar to the phase change memory element 500*a*, with the exception that the phase change memory element 500*b* has a phase change material layer over a conductive spacer structure 520*b*. The conductive spacer structure 520*b* could be formed of any conductive material layer, such as titanium nitride (TiN), titanium aluminum nitride (TiAlN), titanium tungsten (TiW), platinum (Pt) or tungsten (W), among others. Additionally, it should be noted that the first electrode 414 could be formed such that it has a top surface that extends above the top surface of the first dielectric layer 412. As illustrated in FIG. 20A, the phase change material layer 416*b* is formed in contact with the second electrode 430; however, the illustration is not intended to be limiting. For example, the phase change material layer 416*b* could be in contact with the first electrode 414, and the spacer structure 520*b* could be in contact with the second electrode 430. It should also be noted that the phase change material layer 416*b* could be formed between two spacer structures, each spacer structure contacting the first and second electrodes 414, 430, whereby the phase change material layer 416*b* is not in contact with either of the first and second electrodes 414, 430.

Figure 21:
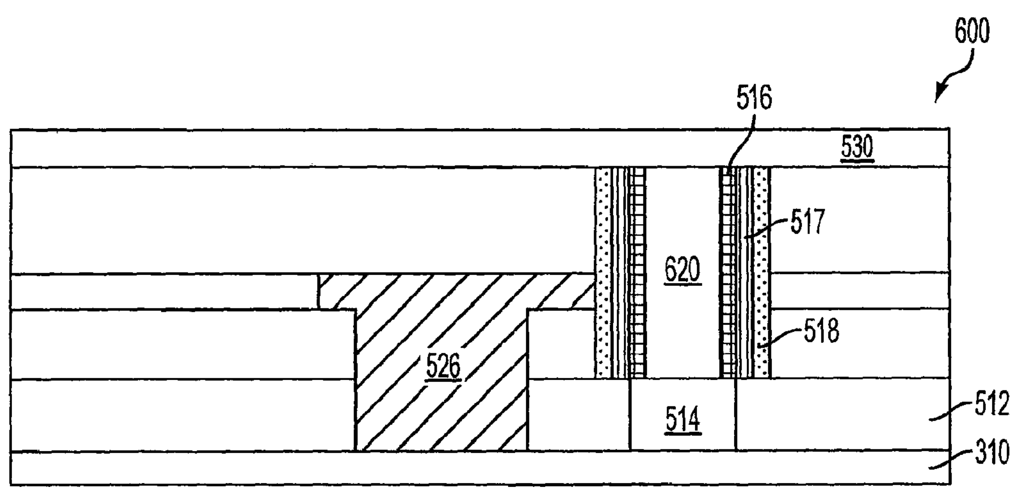
FIG. 21 illustrates a partial cross-sectional view of a phase change memory element constructed in accordance with a tenth embodiment of the invention.

FIG. 21 illustrates a phase change memory element 600 constructed in accordance with yet another embodiment of the of the invention. The phase change memory element 600 includes first, second, and third electrodes 514, 530, 526, respectively. As illustrated, the first and third electrodes 514, 526 are formed within substrate 512, which is formed over substrate 310. A phase change material layer 516 is formed in electrical communication with the first electrode 514. The phase change material layer 516 surrounds a spacer structure 620, which allows for the reduction of the phase change material required to form phase change material layer 516, the features of which are explained above with respect to FIGS. 19A-20B. The phase change material layer 516 is also formed in electrical communication with the second electrode 530.

An insulating material layer 517 is formed in a self-aligning manner on the sidewall regions of the phase change material layer 516. The insulating material layer 517 insulates the phase change material layer 516 from a energy conversion layer 518 that is formed in a self-aligning manner on the sidewall regions of the insulating material layer 517. The energy conversion layer 518 is formed such that it is in electrical communication with the second and third electrodes 530, 526.

During the read operation of the phase change memory element 600, transistors in the periphery that are electrically coupled to the first and second electrodes 514, 530 are simultaneously turned on, and the resistive property of a phase change material layer 516 is read. For example, a high resistance (corresponding to an amorphous state of the phase change material layer 516) may represent a data value of "1." Conversely, a low resistance (corresponding to a crystalline state of the phase change material layer 516) may represent a data value of "0." The information is read out to peripheral circuitry, as discussed above with respect to FIG. 7.

During the write/erase operation of the phase change memory element 600, the second and third electrodes 530, 526 work in conjunction with one another to switch the state of the phase change material layer 516 from amorphous to crystalline or vice versa. In operation, transistors in the periphery that are electrically coupled to the second and third electrodes 530, 526 are turned on to allow current to flow through a energy conversion layer 518, which heats the phase change material layer 516 to switch its state.

Figure 22:
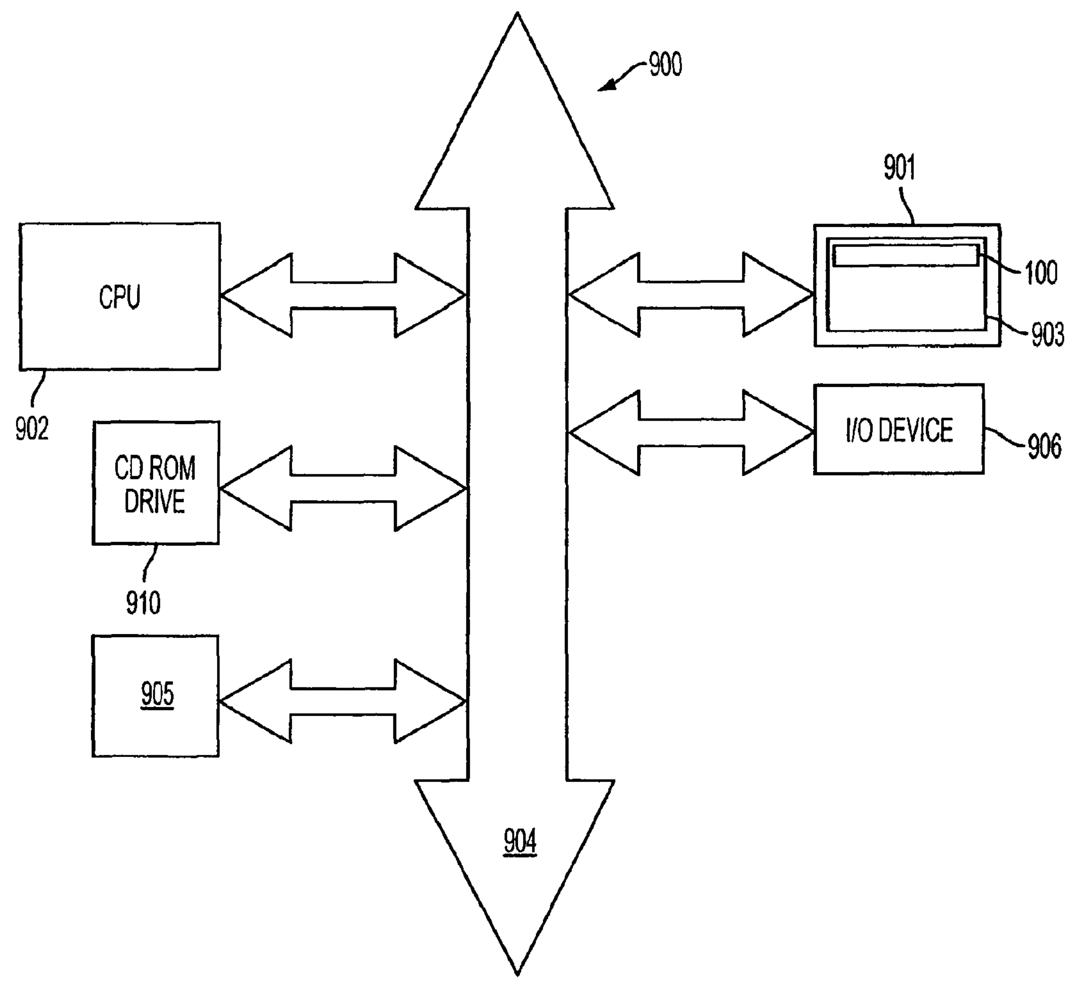
FIG. 22 is a block diagram of a processor system having a memory device incorporating a phase change memory element constructed in accordance with an embodiment of the invention.

FIG. 22 illustrates a simplified processor system 900 which includes a memory circuit 901 having a phase change memory element 100 constructed in accordance with the invention as described above with respect to the embodiments illustrated in FIGS. 2A-21 (e.g., phase change memory element 100, 100', 200, 200', 300, 400, 500, 500*a*, 500*b*, 600). Without being limiting, such a system could include a computer system, camera system, scanner, machine vision, vehicle navigation, video phone, surveillance system, auto focus system, star tracker system, motion detection system, image stabilization system, and other systems employing memory.

The processor system 900, which can be any system including one or more processors generally comprises a central processing unit (CPU) 902, such as a microprocessor, a digital signal processor, or other programmable digital logic devices, which communicates with an input/output (I/O) device 906 over a bus 904. The memory circuit 901 communicates with the CPU 902 over bus 904 typically through a memory controller.

In the case of a computer system, the processor system 900 may include peripheral devices such as a compact disc (CD) ROM drive 910, which also communicate with CPU 902 and hard drive 905 over the bus 904. Memory circuit 901 is preferably constructed as an integrated circuit, which includes a memory array 903 having at least one phase change memory element 100 according to the invention. If desired, the memory circuit 901 may be combined with the processor, for example CPU 900, in a single integrated circuit.

The above description and drawings are only to be considered illustrative of examples of embodiments, which achieve the features of the embodiments of the present invention. Modification and substitutions to specific process conditions and structures can be made without departing from the spirit and scope of the present invention. Accordingly, the invention is not to be considered as being limited by the foregoing description and drawings, but is only limited by the appended claims.

What is claimed as new and desired to be protected by Letters Patent of the United States is:

1. A method of forming a memory element, the method comprising the acts of:

forming a first electrode over a substrate;

forming a first electrically isolating material element over the first electrode;

forming a phase change material layer over the first electrode and within a first via formed in the first electrically isolating material element, the phase change material having a lower surface in electrical communication with the first electrode;

forming a energy conversion layer in association with the phase change material layer, the energy conversion layer capable of switching the phase associated with the phase change material layer;

forming a second electrode in electrical communication with an upper surface of the phase change material layer and a first portion of the energy conversion layer; and forming a third electrode in electrical communication with a second portion of the energy conversion layer.

2. The method of claim 1, wherein the via is formed to have an angled opening.

3. The method of claim 2, wherein the via is formed to have a first opening and a second opening, the first and second openings being different from one another.

4. The method of claim 1, wherein the phase change material layer is formed to a shape that is determined at least in part to the shape of the electrically isolating material layer.

5. The method of claim 4, wherein the energy conversion layer is formed to a shape that is determined at least in part to the shape of the electrically isolating material layer.

6. The method of claim 4, wherein the electrically isolating material layer is formed substantially vertical to a topmost surface of the substrate.

7. A method of forming a memory element comprising:

forming a first dielectric layer over a substrate, and filling a via within the first dielectric layer with a conductive material to form a first conductive material layer;

forming a first electrically isolating material layer over the first dielectric layer;

forming second and third conductive material layer over the first electrically isolating material layer;

forming a second dielectric layer between the second and third conductive material layers;

forming a via within the first and second dielectric material layers, extending through an upper surface of the second dielectric layer to an upper surface of the first electrically isolating material layer;

forming a energy conversion layer on sidewalls of the via, wherein the energy conversion layer is in electrical communication with the second and third conductive material layers;

forming a second electrically isolating material layer over exposed portions of the energy conversion layer within the via;

etching a portion of the first electrically isolating material layer such that the via extends from the upper surface of the second dielectric material layer to the first conductive material layer;

forming a phase change material layer within the via, wherein the phase change material layer in electrical communication with the first conductive material layer; and forming a fourth conductive material layer in electrical communication with the phase change material layer.

8. The method of claim 7, further comprising the steps of forming first, second, third, and fourth transistors capable of activating the first, second, third, and fourth conductive material layers, respectively.

9. The method of claim 7, further comprising the steps of forming a diode coupled between the energy conversion layer and at least one of the third and fourth electrodes.

10. A method of operating a memory element comprising a first, second, and third conductive material layers, the method comprising: activating the first and third conductive material layers such that current flows through an energy conversion layer surrounding a phase change material layer, the current being capable of switching the state associated with the phase change material layer, wherein the first, second, and third conductive material layers are different from each other and the first conductive material layer is in electrical communication with the energy conversion layer and the phase change material.

11. The method according to claim 10, further comprising activating the second and first conductive material layers such that current flows through the phase change material layer, wherein the resistive state of the phase change material layer can be detected.

12. The method of claim 1, further comprising:

forming a second electrically isolating material element over the substrate;

forming the first electrode within a second via formed in the second electrically isolating material element;

forming a third electrically isolating material element over the energy conversion layer; and forming a fourth electrically isolating material element on the sidewalls of the first via, wherein the first via is formed within the third electrically isolating material element, energy conversion layer, and first electrically isolating material element to an upper surface of the first electrode.

13. The method of claim 12, wherein the energy conversion layer is formed over the first electrically isolating material element and the phase change material layer is formed over the third electrically isolating material element.

14. The method of claim 12, further comprising:

forming a fifth electrically isolating material element over the third electrically isolating material element, wherein a portion of the phase change material is in between a first portion of the fifth electrically isolating material element and a first portion of the third electrically isolating material element.

15. The method of claim 14, wherein a second portion of the fifth electrically isolating material element and a second portion of the third electrically isolating material element are in contact.

16. The method of claim 1, further comprising:

forming a second electrically isolating material element over the substrate;

forming the first electrode within a second via formed in the second electrically isolating material element; and forming a third electrically isolating material layer over the first electrically isolating material element, wherein the first via is formed within the third and first electrically isolating material elements to an upper surface of the first electrode, and the energy conversion layer is formed on the sidewalls of the first via.

17. The method of claim 16, further comprising forming a fourth electrically isolating material element on the sidewalls of the energy conversion material.

18. The method of claim 17, wherein the second electrode is formed within the first via above the Energy conversion layer, the fourth electrically isolating material element, and the phase change material.

* * * * *